(12) United States Patent
Tyler et al.

(10) Patent No.: US 7,013,834 B2
(45) Date of Patent: Mar. 21, 2006

(54) PLASMA TREATMENT SYSTEM

(75) Inventors: James Scott Tyler, Galt, CA (US);
James D. Getty, Vacaville, CA (US);
Thomas V. Bolden, II, Petaluma, CA
(US); Robert Sergei Condrashoff,
Walnut Creek, CA (US)

(73) Assignee: Nordson Corporation, Westlake, OH (US)

(*) Notice: Subject to any disclaimer, the term of this patent is extended or adjusted under 35 U.S.C. 154(b) by 191 days.

(21) Appl. No.: 10/324,436

(22) Filed: Dec. 20, 2002

(65) Prior Publication Data
US 2003/0196760 A1 Oct. 23, 2003

Related U.S. Application Data

(60) Provisional application No. 60/374,010, filed on Apr. 19, 2002.

(51) Int. Cl.
*C23C 16/00* (2006.01)
*H01L 21/00* (2006.01)

(52) U.S. Cl. .............................. 118/723 E; 156/345.43; 156/345.47

(58) Field of Classification Search ............ 118/723 E, 118/723 R, 719, 715; 156/345.43, 345.44, 156/345.45, 345.46, 345.47, 345.3, 345.35
See application file for complete search history.

(56) References Cited

U.S. PATENT DOCUMENTS

| | | | | |
|---|---|---|---|---|
| 4,971,653 A | * | 11/1990 | Powell et al. ................ 438/5 |
| 5,180,435 A | | 1/1993 | Markunas et al. .......... 118/723 |
| 5,304,250 A | * | 4/1994 | Sameshima et al. .. 118/723 ER |
| 5,468,955 A | | 11/1995 | Chen et al. ................. 250/251 |
| 5,795,831 A | | 8/1998 | Nakayama et al. ......... 438/714 |
| 5,823,416 A | * | 10/1998 | Haji ............................ 228/4.5 |
| 5,919,332 A | | 7/1999 | Koshiishi et al. ........... 156/345 |
| 5,997,649 A | * | 12/1999 | Hillman ...................... 118/715 |
| 6,029,602 A | | 2/2000 | Bhatnagar ............ 118/723 ME |
| 6,074,518 A | * | 6/2000 | Imafuku et al. ....... 156/345.46 |
| 6,165,313 A | | 12/2000 | Winters et al. ............. 156/345 |
| 6,245,396 B1 | * | 6/2001 | Nogami ...................... 427/562 |
| 6,263,831 B1 | | 7/2001 | Gorin .................... 118/723 IR |

(Continued)

FOREIGN PATENT DOCUMENTS

GB 2 295 485 5/1996

OTHER PUBLICATIONS

Australian Patent Office, Search Report of Corresponding Singapore Application No. SG 200302160-7, Mailing Date: Dec. 1, 2004, (1 page).

*Primary Examiner*—Parviz Hassanzadeh
*Assistant Examiner*—Michelle Crowell
(74) *Attorney, Agent, or Firm*—Wood, Herron & Evans, L.L.P.

(57) ABSTRACT

A plasma treatment system for treating a workpiece with a downstream-type plasma. The processing chamber of the plasma treatment system includes a chamber lid having a plasma cavity disposed generally between a powered electrode and a grounded plate, a processing space separated from the plasma cavity by the grounded plate, and a substrate support in the processing space for holding the workpiece. A direct plasma is generated in the plasma cavity. The grounded plate is adapted with openings that remove electrons and ions from the plasma admitted from the plasma cavity into the processing space to provide a downstream-type plasma of free radicals. The openings may also eliminate line-of-sight paths for light between the plasma cavity and processing space. In another aspect, the volume of the processing chamber may be adjusted by removing or inserting at least one removable sidewall section from the chamber lid.

10 Claims, 17 Drawing Sheets

U.S. PATENT DOCUMENTS

| | | | |
|---|---|---|---|
| 6,328,847 B1 | 12/2001 | Winters | 156/345 |
| 6,427,623 B1 * | 8/2002 | Ko | 118/723 E |
| 6,468,925 B1 * | 10/2002 | Campbell et al. | 438/771 |
| 2001/0006169 A1 | 7/2001 | Hogan et al. | |
| 2001/0042799 A1 | 11/2001 | Kim et al. | |
| 2002/0129769 A1 * | 9/2002 | Kim et al. | 118/723 E |

* cited by examiner

PLASMA TREATMENT SYSTEM

CROSS REFERENCE TO RELATED APPLICATIONS

This application claims the benefit of U.S. Provisional Application No. 60/374,010, filed Apr. 19, 2002, the disclosure of which is hereby incorporated by reference herein in its entirety.

FIELD OF THE INVENTION

The present invention relates generally to plasma processing, and more particularly to a plasma treatment system configured to perform downstream-type plasma treatments.

BACKGROUND OF THE INVENTION

Plasma treatment is commonly applied for modifying the surface properties of workpieces used in applications relating to integrated circuits, electronic packages, and printed circuit boards. Plasma treatment systems are configured to produce a direct plasma from a process gas and expose a surface of a substrate or workpiece with generated active species from the direct plasma to remove surface atoms by physical sputtering, chemically-assisted sputtering, or chemical reactions. The physical or chemical action may be used to condition the surface to improve properties such as adhesion, to selectively remove an extraneous surface layer of a process material, or to clean undesired contaminants from the surface. Plasma treatment is used in electronics packaging, for example, to increase surface activation and/or surface cleanliness for eliminating delamination and bond failures, improving wire bond strength, ensuring void free underfill, removing oxides, enhancing die attach, and improving adhesion for encapsulation.

Plasma treatment systems may be integrated into in-line and cluster systems or batch processes in which groups of workpieces are processed by successive plasma exposures or processing cycles. Workpieces may be supplied by various methods, include delivery in a magazine, individual delivery by a conveyer transport system, or manual insertion into the process chamber. Plasma treatment systems may also be provided with automated robotic manipulators that coordinate workpiece exchange into and out of the process chamber for plasma processing operations.

Conventional plasma treatment systems have failed to provide adequate process uniformity across the surface of individual workpieces. The plasma density must be precisely and accurately controlled at all positions on the surface of the workpiece so that it is substantially uniform across the surface. Critical parameters for controlling the uniformity of the plasma include the spatial uniformity of the excitation power and the dispersion of the process gas. A non-uniform plasma density at the surface of the workpiece degrades process reliability and reduces the process yield. To achieve workpiece-to-workpiece uniformity, the process gas must be evenly dispersed and uniformly ionized by the excitation power so that the flux of active species is spatially uniform across the surface of the workpiece.

Conventional plasma treatment systems have likewise failed to achieve adequate reproducibility of the plasma treatment between successive batches of workpieces. Batch-to-batch reproducibility depends on the precise control of process variables and parameters so that successive workpieces are exposed to substantially identical plasma conditions. Moreover, conventional plasma treatment systems are incapable of rapidly processing workpieces with a throughput amenable to automated process lines or fabrication requirements. System throughput and uniformity of the plasma treatment must be maximized for reducing production costs.

Conventional in-line plasma treatment systems also lack the ability to generate a downstream-type plasma that is substantially free of ions, electrons and light in at least the visible region of the electromagnetic spectrum. As is well-known, a direct plasma is a combination of multiple different species including ions and electrons that have a net charge and source gas molecules and free radicals that are neutral. Free radicals are gas molecules that are nearly ionized yet retain their full complement of electrons so they are neither positively nor negatively charged. Workpieces may be processed with a direct plasma containing all plasma species or with a downstream-type plasma including primarily free radicals. Processing workpieces with a direct plasma promotes treatment with both physical action due to ion and electron bombardment and chemical action arising from surface interaction of the free radicals. On the other hand, processing with the downstream-type plasma involves primarily chemical action.

Conventional plasma treatment systems generally include a fixed dimension plasma chamber and a substrate support in the plasma chamber that holds the workpiece at a fixed position between opposed treatment electrodes. Because the workpiece is located at a fixed position, the surface to be plasma treated is likewise spaced relative to the treatment electrodes. The fixed position is chosen to provide a spacing effective to provide an effective plasma treatment for workpieces of a given thickness. It follows that, as the thickness of the workpiece being treated in the system changes, the location of the surface is no longer at the desired fixed position so that the efficiency of the plasma treatment may be reduced. Therefore, conventional plasma treatment systems are ill equipped to accommodate changes in workpiece thickness.

There is thus a need for an in-line plasma treatment system that can provide a downstream-type plasma for treating workpieces in the plasma chamber and that can accommodate workpieces of differing thickness while maintaining an effective treatment efficiency.

SUMMARY

The present invention addresses these and other problems associated with the prior art by providing a plasma treatment system capable of performing a downstream-type plasma treatment. The plasma treatment system includes a vacuum chamber including a processing space, a chamber lid, and a plasma cavity defined in the chamber lid, a workpiece holder positioned in the processing space, a vacuum source coupled in fluid communication with the vacuum chamber, a process gas supply coupled in fluid communication with the vacuum chamber, and a first plasma excitation source. The plasma cavity and processing space are in fluid communication. The process gas supply is capable of providing process gas to at least the plasma cavity, the vacuum source is capable of evacuating the processing space and the plasma cavity, and the first plasma excitation source is operable for exciting process gas in the plasma cavity to generate a plasma. The plasma excitation source further includes a grounded plate positioned between the plasma cavity and the processing space. The grounded plate includes a plurality of openings capable of prohibiting or, at the least, substantially reducing the transfer of charged species, such as ions and electrons, from the plasma cavity to the processing space. However, the openings preferentially allow the transfer of free radicals from the plasma cavity to the processing space. According to this aspect of the invention, a downstream-type plasma free, or substantially free, of charged particles and photons can be generated at the workpiece for performing plasma treatments by the chemical action of the radicals without the physical action otherwise provided by the charged particles.

According to the principles of the invention, a method is provided for treating a workpiece with a plasma. The method includes placing the workpiece in a processing space of a plasma processing system, generating a direct plasma comprising charged species and free radicals, filtering charged species from the direct plasma to create a downstream-type plasma including free radicals, and exposing the workpiece in the processing space to the free radicals in the downstream-type plasma.

According to another aspect of the invention, a plasma treatment system includes a vacuum chamber having a chamber base and a chamber lid movable relative to the chamber base between a closed position that defines a processing space and an open position for transferring a workpiece into and out of the processing space, a vacuum source coupled in fluid communication with the vacuum chamber, a workpiece holder located in the processing space, a process gas supply in fluid communication with the vacuum chamber, and a plasma excitation source. The process gas supply is capable of providing process gas to the processing space, the vacuum source is capable of evacuating the processing space, and the plasma excitation source is operable to provide a plasma in the processing space generated from the process gas. The chamber lid further includes a first sidewall section capable of being removed from the chamber lid for changing a vertical dimension of the vacuum chamber. According to this aspect of the invention, the vertical dimension of the chamber may be varied to accommodate workpieces of differing thickness by compensating for substrate thickness by placing the exposed surface of the workpiece at a predictable distance from the treatment electrode.

According to the principles of the invention, a method is provided for plasma treating a workpiece in a processing space of a vacuum chamber having a chamber lid. The method comprises placing a workpiece in the processing space, and varying a volume of the chamber lid to alter the distance from an exposed surface of the workpiece to a treatment electrode positioned in the chamber lid based upon a thickness of the workpiece.

These and other objects and advantages of the present invention shall become more apparent from the accompanying drawings and description thereof.

BRIEF DESCRIPTION OF THE FIGURES

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION OF THE INVENTION

The present invention, in accordance with the principles and objectives herein, provides an apparatus and a method for processing a workpiece with a plasma. The present invention provides a plasma treatment system configured to provide a uniformly dense plasma, rapid pump-down and venting cycles, reproducible processing conditions, and simplified material handling. The system advantageously requires a reduced excitation power to initiate and sustain a uniformly dense plasma in the processing space, while employing a control algorithm that minimizes the cycle time required to process each successive workpiece.

Figure 1:
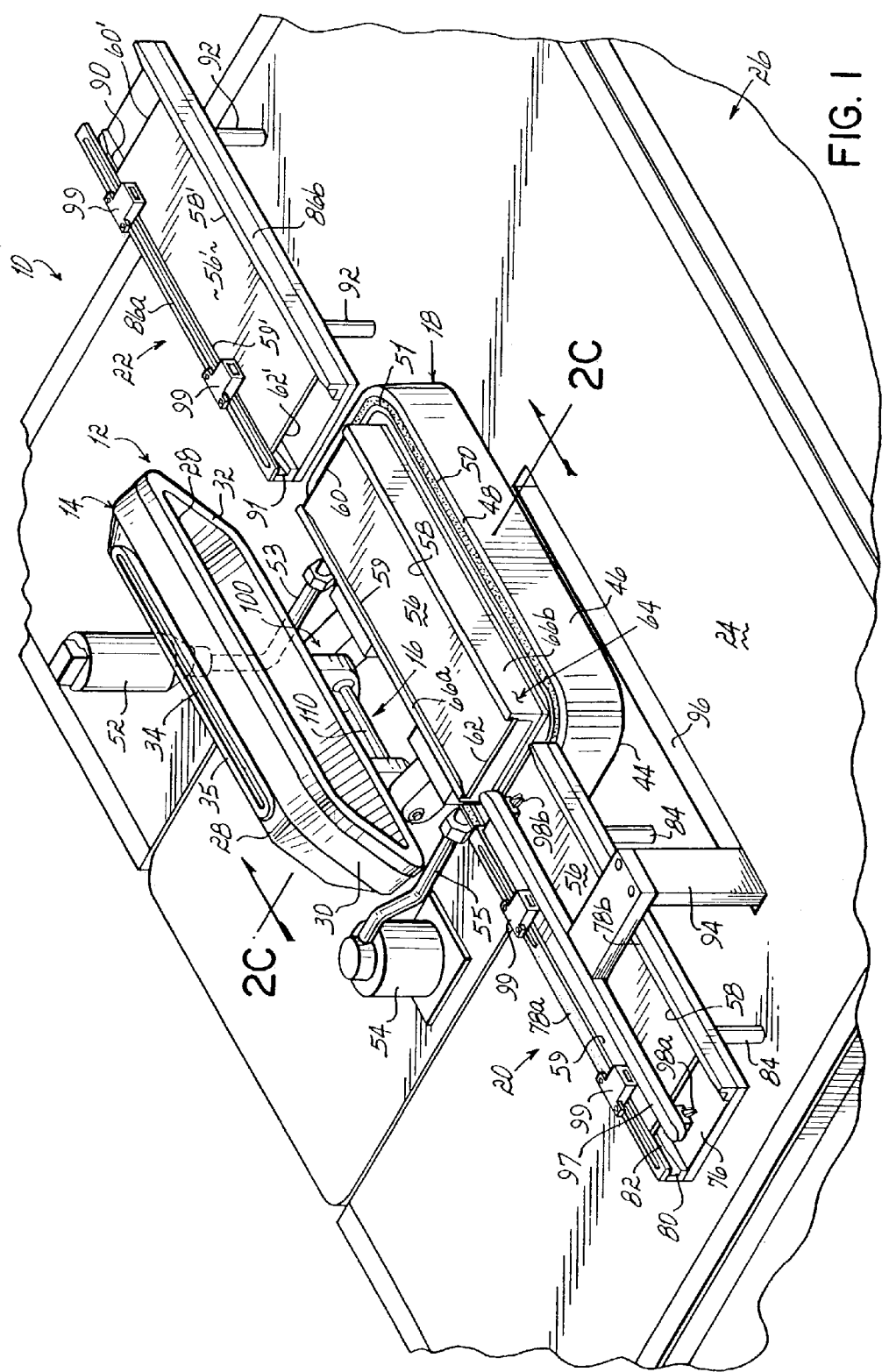
FIG. 1 is a perspective view of a plasma treatment system in accordance with the principles of the present invention.
Figure 2A:
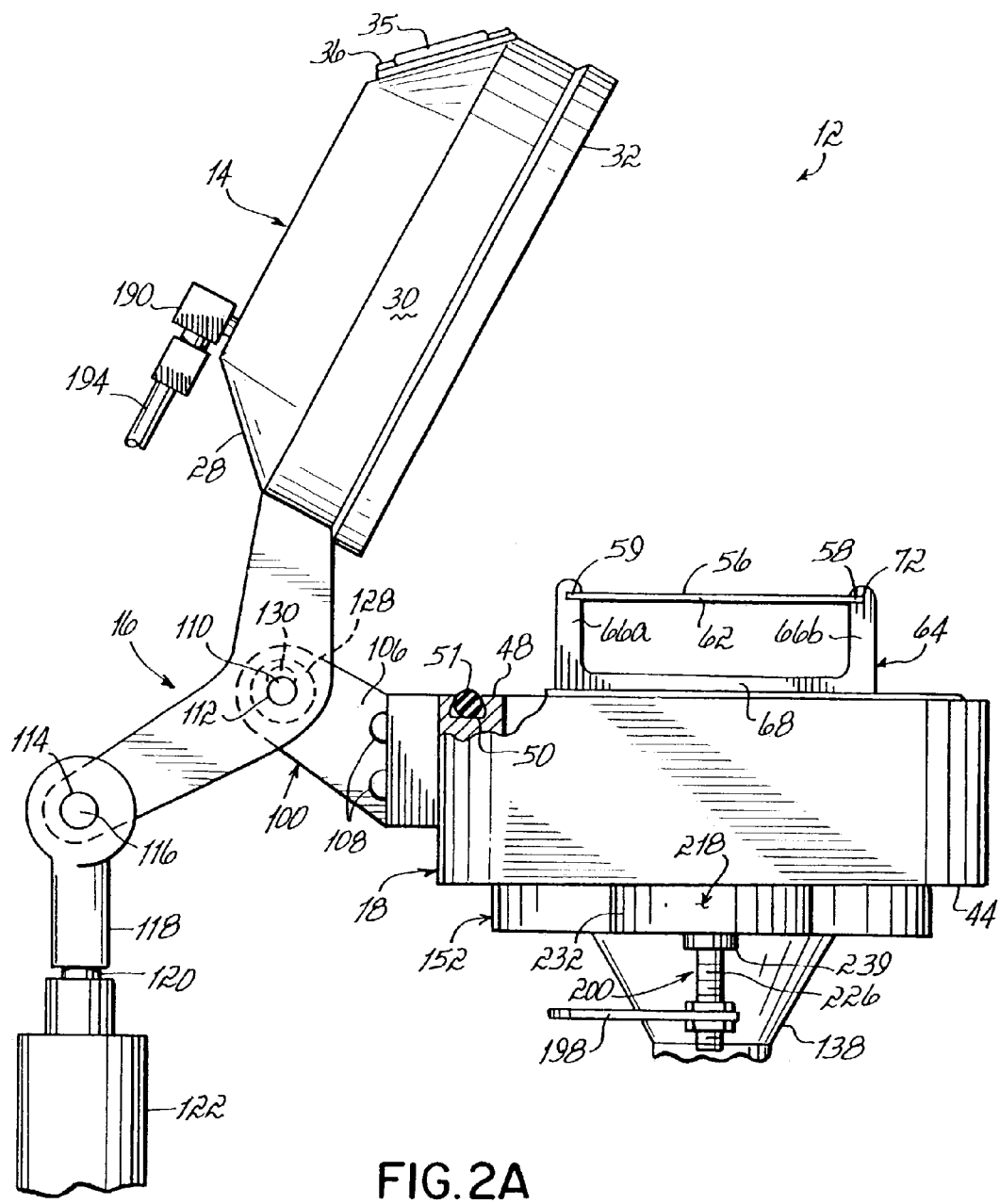
FIG. 2A is a side schematic and partially broken view of the plasma treatment system of FIG. 1.
Figure 2B:
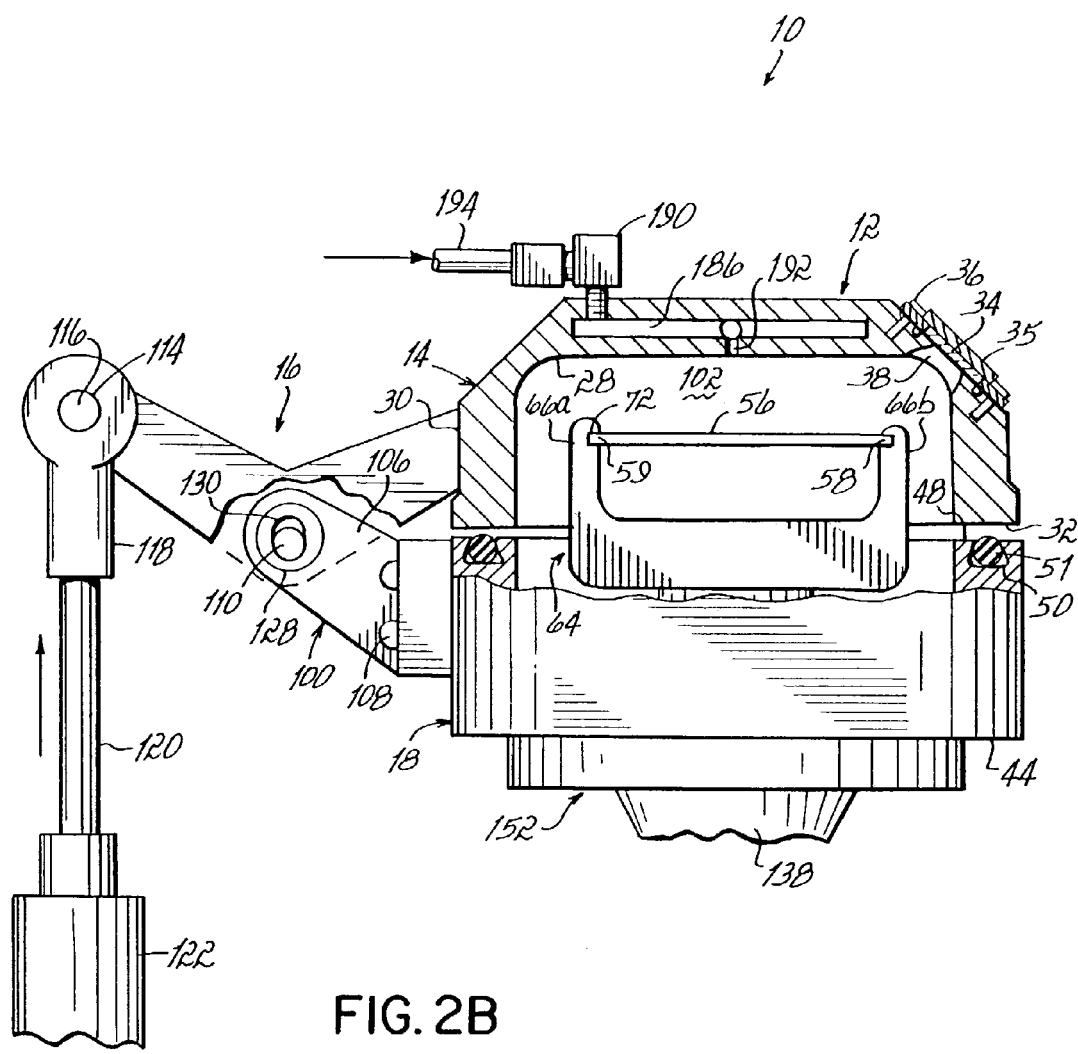
FIG. 2B is a side schematic and partially broken view of the plasma treatment system of FIG. 1 in which the chamber lid is in a closed position.

A plasma treatment system 10, in accordance with the principles of the present invention, is illustrated in FIGS. 1, 2A–2C and 3. Referring to FIG. 1, plasma treatment system 10 includes a processing chamber 12, a loading station 20, and an exit station 22, which are situated on a substantially flat and mechanically stable surface 24 atop an instrument cabinet 26. Processing chamber 12 includes a chamber lid 14 hingeably connected to a chamber base 18 by a hinge assembly 16. Chamber lid 14 is selectively positionable between an open position, as shown in FIGS. 1 and 2A, and a closed position, as shown in FIG. 2B. Chamber base 18 and chamber lid 14 are preferably formed of an electrically conductive material suitable for high-vacuum applications, such as an aluminum alloy or a stainless steel.

Figure 2C:
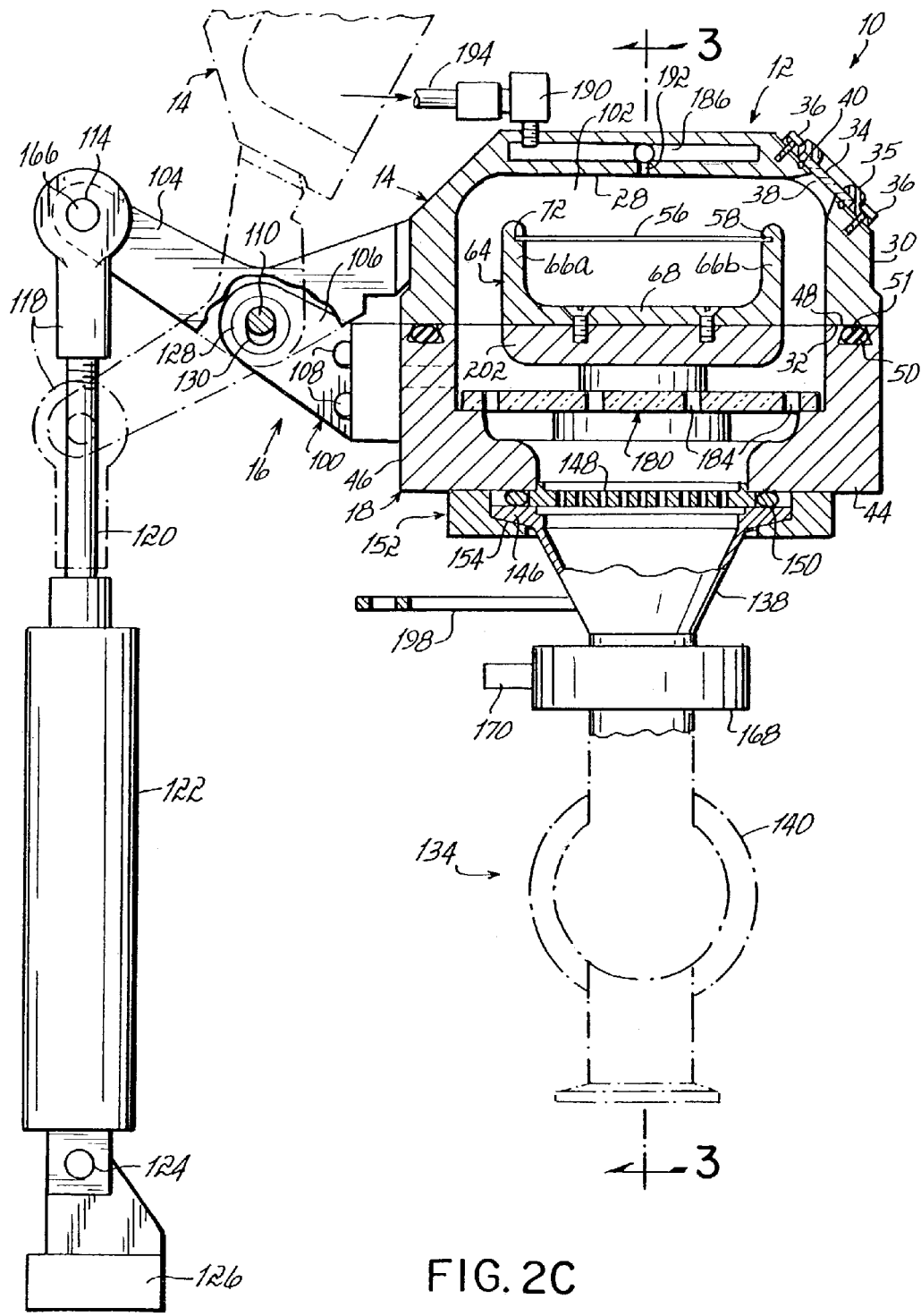
FIG. 2C is a detailed side view of the plasma treatment system of FIG. 1.

Chamber lid 14 includes a domed ceiling 28 and an integral sidewall 30 encircled by a flat rim 32. A viewport opening 38 is provided in ceiling 28 for holding a viewport 34. As best shown in FIG. 2C, viewport 34 is a substantially planar panel attached to chamber lid 14 by a frame 35 and fasteners 36. An O-ring 40 is received within a groove 42 that circumscribes viewport opening 38. Viewport 34 compressively engages O-ring 40 to create a vacuum-tight seal, where the sealing force is supplied collectively by the pressure differential between the interior and exterior of processing chamber 12 and by fasteners 36. Viewport 34 is constructed of a dielectric ceramic, such as quartz, that has a low sputtering coefficient, is gas impermeable, and has a wide transmission range for optical wavelengths. O-ring 40 is preferably formed of an elastomer such as Viton®.

Chamber base 18 includes a floor wall 44 integral with a sidewall 46 which is encircled by a flat lip 48. Lip 48 includes a circumferential groove 50 for receiving a conductive resilient sealing member or O-ring 51 that provides an electrically-conductive pathway and a substantially vacuum-tight seal between chamber lid 14 and chamber base 18. The dimensions of groove 50 and O-ring 51 are selected for creating a vacuum-tight seal. It may be appreciated that O-ring groove 50, and therefore O-ring 51, may be positioned in either chamber lid 14 or chamber base 18 without departing from the spirit and scope of the present invention. It is appreciated that particulates from the surrounding environment are less likely to attach to, and compromise the sealing ability of, O-ring 51 if positioned in chamber lid 14.

O-ring 51 is a conductive elastomer gasket, preferably formed of a composite of a conductive fill powder impregnated in an elastomer binder, such as a powder of silver and aluminum in silicone. An exemplary O-ring 51 is formed of a conductive composite manufactured and marketed under the trade name Cho-seal® by EMI Shielding Products, a division of Parker Hannifin Corp. (Cleveland, Ohio).

In another aspect, chamber base 18 further includes a workpiece holder or substrate support 64 configured to receive and support a part or workpiece 56. Generally, workpiece 56 is a rectangular, planar structure that includes a periphery having opposed side edges 58, 59 of a predetermined thickness, a leading edge 60, and a trailing edge 62. Opposed side edges 58, 59 are separated by a predetermined maximum transverse width that is measured perpendicular to a longitudinal axis of workpiece 56. Workpiece 56 may be a strip type part, such as a ball grid array (BGA) or a metal lead frame, singulated BGA's carried in an Auer boat, or a pallet carrying multi-chip electronic modules, integrated circuit chips, or the like. Workpiece 56 may also be any disk-shaped semiconductor wafer or substrate formed of silicon, gallium arsenide, and other semiconductor materials familiar to persons of ordinary skill in the art and may include patterned areas of metallization, contacts, insulating layers and the like.

Figure 3:
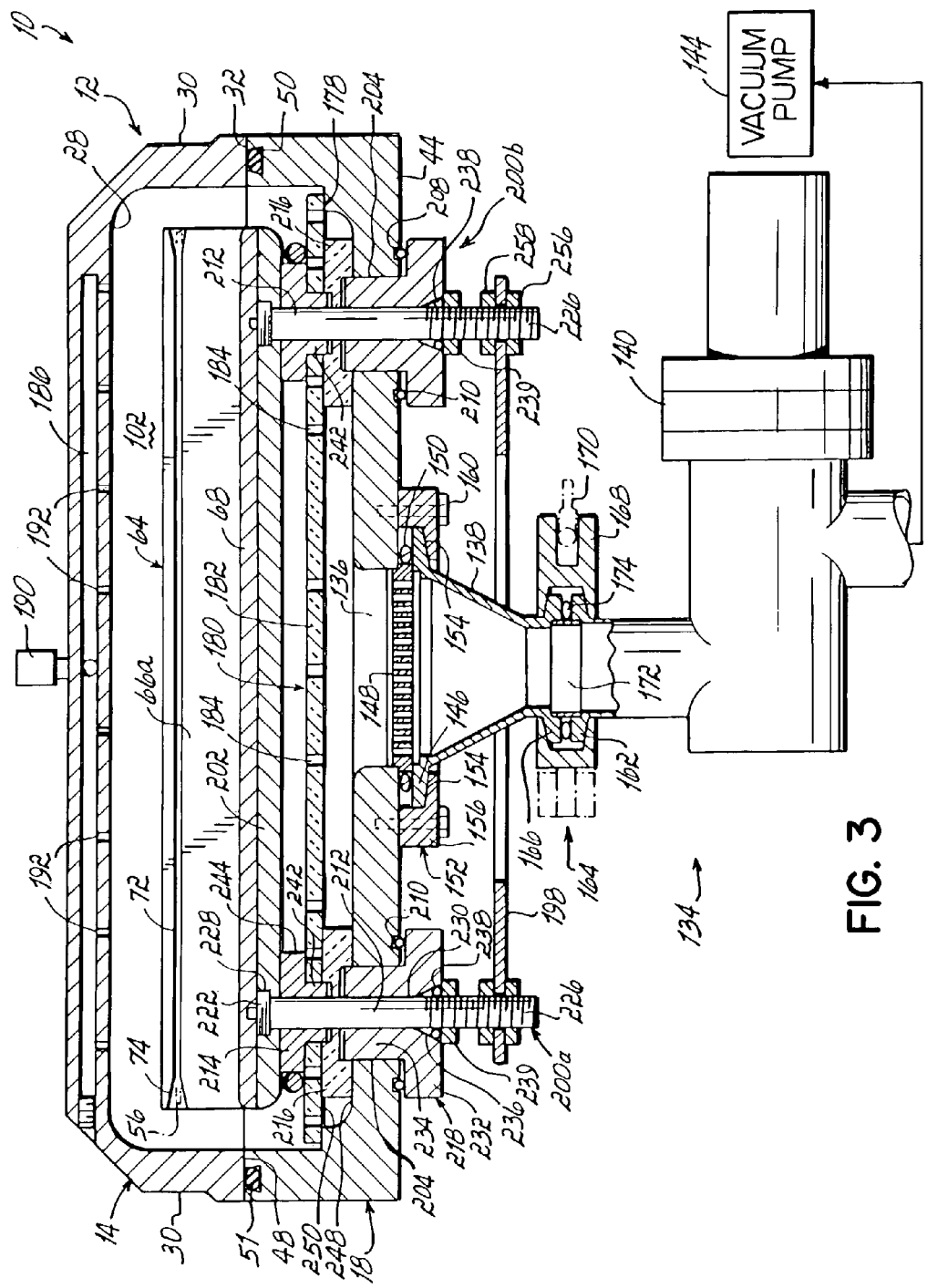
FIG. 3 is a front view of the plasma treatment system of FIG. 1.

As best depicted in FIG. 2C, substrate support 64 comprises opposed side rails 66a, 66b that extend vertically from a substantially planar support platform 68. Side rail 66a is in a spaced relationship relative to side rail 66b along the longitudinal axis of support platform 68 so that the maximum width between side edges 58 and 59 of workpiece 56 may be accommodated. For convenience, side rail 66a will be detailed below with the understanding that side rail 66b has an identical structure. Side rail 66a protrudes above a horizontal plane that includes lip 48 and incorporates an elongate channel 72, as best shown in FIG. 3, that extends parallel to a longitudinal axis of substrate support 64. Channel 72 has a U-shaped cross-sectional profile that is dimensioned to slidingly receive side edge 59 of workpiece 56 therein. Opposed extremities of channel 72 include a flared lip 74, as best shown in FIG. 3, that physically captures side edge 59 of workpiece 56 during loading. By way of example and not limitation, the processing chamber 12 and the substrate support 64 may be configured to accept workpieces 56 having maximum dimensions of 2.7" (wide)× 9.25" (long)×⅜" (thick) or maximum dimensions of 6"×12"×1". In other embodiments, the processing chamber 12 may be configured to accept workpieces 56 having maximum plan dimensions of 12" by 12".

Referring to FIG. 1, loading station 20 and exit station 22 are proximate to respective opposed ends of processing chamber 12 and are adapted for shuttling workpieces 56, 56' into and out of processing chamber 12. Loading station 20 includes a substantially planar support platform 76 and opposed loading side rails 78a and 78. Loading side rail 78a is in a spaced relationship relative to loading side rail 78b along the longitudinal axis of support platform 76 so that the maximum width of workpiece 56 may be accommodated. For convenience, side rail 78a will be detailed below with the understanding that side rail 78b is substantially identical. Loading side rail 78a protrudes above a horizontal plane that includes lip 48 and incorporates an elongate channel 82. Channel 82 has a U-shaped cross-sectional profile that is dimensionally adapted to slideably receive one opposed side edge 58 or 59 of workpiece 56 therein. Opposed extremities of channel 82 include a flared lip 80 that physically captures the side edges 58, 59 of workpiece 56. Support posts 84 extend from a bottom surface of the support platform 76 to surface 24.

Exit station 22 is configured similarly to loading station 20. Exit station 22 includes opposed unloading side rails 86a, 86b that extend upwardly and outwardly from a planar support platform 88. For convenience, side rail 86a will be detailed below with the understanding that side rail 86b has an identical structure. Side rail 86a protrudes above a horizontal plane that includes rim 48 and incorporates a longitudinal channel 90. Channel 90 has a U-shaped cross-sectional profile that is dimensioned to slideably receive one of the two peripheral edge 58', 59' of processed workpiece 56' therein. Opposed extremities of channel 90 include a flared lip 91 that aids in physically capturing the side edges 58', 59' of processed workpiece 56' during unloading. Support posts 92 extend from a bottom surface of support platform 88 to surface 24.

Plasma treatment system 10 further includes pinch wheels 99 attached to loading station 20 and exit station 22 and a positioning lever 94. Pinch wheels 99 are operable to make fine adjustments in the positioning of workpiece 56 or workpiece 56'. Lever 94 is operable to move along the length of a slot 96 defined in the top surface 24 of instrument cabinet 26 and to also translate vertically. A driving mechanism (not shown) is attached to lever 94 and is operable to move arm 94 vertically and longitudinally in slot 96. Lever 94 is positioned entirely outside of processing chamber 12 during a plasma processing cycle.

Positioning lever 94 further includes a rod 97 having a first finger 98a that selectively abuts a rear edge 62 of workpiece 56 held between loading side rails 78a,b and a second finger 98b that selectively abuts a rear edge 62 of second workpiece 56 held between sides rails 66a,b. It may be appreciated that fingers 98a,b can be resiliently biased relative to rod 97 and, in addition, that fingers 98a,b may further include a sensor for detecting resistance in the linear movement of positioning lever 94 due to, for example, a workpiece misaligned with a set of side rails.

During a workpiece loading operation, workpiece 56 is delivered by an automated conveying system (not shown) and positioned in loading side rails 78a,b on loading station 20. Pinch wheels 99 of loading station 20 are used to move the workpiece 56 short distances for proper positioning. After chamber lid 14 is opened, positioning lever 94 is lowered from its initial position and linearly actuated so that finger 98a will engage rear edge 62 and push workpiece 56 along loading side rails 78a,b toward substrate support 64. The front edge 60 of workpiece 56 will traverse the gap between loading side rails 78a,b and side rails 66a,b. Opposed side edges 58, 59 of workpiece 56 will be slideably received by side rails 66a,b. Thereafter, the positioning lever 94 will continue to push the workpiece 56 until it is suitably and accurately positioned on substrate support 64. Preferably, the center of workpiece 56 is positioned coaxial with the central vertical axis or centerline of the processing chamber 12. Positioning lever 94 then translates vertically so that finger 98b will clear the leading edge of workpiece 56 as lever 94 is retracted to its initial position.

If processed workpiece 56' resides on substrate support 64 during the workplace loading operation, finger 98b engages rear edge 62' and positioning lever 94 sweeps the processed workpiece 56' toward exit station 22. Front edge 60' of processed workpiece 56' will cross the gap between the processing chamber 12 and exit station 22. Side edges 58', 59' of processed workpiece 56' are captured by unloading side rails 86a,b. With continued linear movement, processed workpiece 56' is completely removed from processing chamber 12. Pinch wheels 99 of exit station 22 are used to move the workpiece 56' short distances for proper positioning in preparation for transport to the next processing station.

Hinge assembly 16 is adapted so that chamber lid 14 may be selectively pivoted relative to chamber base 18 between an open position, as best illustrated in FIG. 2A, and a closed position, as best illustrated in FIG. 2B. Hinge assembly 16 includes at least two brackets 100, as best shown in FIG. 1, that are disposed in a spaced relationship along the non-vacuum side of sidewall 46. When chamber lid 14 is cantilevered into a closed position, chamber lid 14 and chamber base 18 bound a vacuum-tight processing space 102, as shown for example in FIG. 2B.

Each bracket 100 includes a V-shaped brace 104 and a nub 106 mounted with fasteners 108 to a non-vacuum side of sidewall 46. Each brace 104 is carried by a hinge pin 110 received within an aperture 112 near the bend in brace 104 and within a coaxial aperture 124 in nub 106. As shown in FIG. 1, hinge pin 110 is shared by both brackets 100. Returning to FIG. 2A, one end of brace 104 is connected to the non-vacuum side of sidewall 30 of chamber lid 14. A second end of each brace 104 includes an aperture 114 that receives a connecting rod 116 that is also shared by both braces 104.

Connecting rod 116 is further attached to a rod end 118 that is threadingly carried by one end of a piston rod 120 of a bi-directional pneumatic cylinder or lid actuator 122. Rod end 118 further includes an aperture (not shown but similar to, and collinear with, aperture 114) with an inner diameter sized to slideably receive connecting rod 116 therein. Piston rod 120 is adapted for reciprocating linear, vertical motion so that brace 104 can pivot about hinge pin 110 to cantilever chamber lid 14 between an open position and a closed position. As shown in FIG. 2C, the opposed end of lid actuator 122 is affixed via a mounting block 126 to a structural support (not shown) within instrument cabinet 26.

Referring to FIG. 2B, in one aspect of the present invention, an obround bearing 128 is slidingly received within aperture 124 of nub 106. Obround bearing 128 has an exterior, annular surface of an outer diameter chosen to frictionally fit within aperture 124 and an interior bore 130 that is dimensioned to receive hinge pin 110. Bore 130 has a substantially oval cross-sectional profile with a vertical major axis, as viewed normal to the longitudinal axis of bore 130. When chamber lid 14 is in an open position, as shown in FIG. 2B, a length of one end of hinge pin 110 will contact a lower interior surface of bore 130. As chamber lid 14 is pivoted by the lid actuator 122, hinge pin 110 rotates about a longitudinal axis thereof. During rotation, the outer surface of hinge pin 110 remains in contact with the lower interior surface of bore 130. When lip 32 contacts the surface of O-ring 51, as shown in FIG. 2B, lid actuator 122 will continue to extend so that the chamber lid 14 moves downward to compress O-ring 51. Due to the presence of obround bearing 128, hinge pin 110 is free to translate vertically upward in bore 130.

Referring to FIG. 2C, in which the chamber lid 14 resides in a closed position, the interior peripheral surface of the chamber lid 14 and chamber base 18 bounds processing space 102. The vacuum seal is enhanced by the further compression of O-ring 51 between chamber base 18 and chamber lid 14. The additional compression of O-ring 51 results from the pressure differential between atmospheric pressure acting on the exterior of chamber lid 14 and the vacuum within processing chamber 12 that applies a force that urges chamber lid 14 vertically downward towards chamber base 18. Hinge pin 110 translates vertically and with minimal transverse motion due to the presence of obround bearing 128.

Bore 130 within obround bearing 128 affords an additional degree of vertical freedom for hinge pin 110, as compared with a conventional bearing having a bore of a circular cross-sectional profile. Chamber lid 14 is free to move vertically in response to the forces that compress O-ring 51. As a result, the vacuum-tight seal between lip 32 and O-ring 51 is uniform about the circumference of groove 50. In a preferred embodiment, the presence of obround bearing 128 provides approximately 50 mils of vertical movement for hinge pin 110.

A pressure gauge 52 is connected via tubing 53 to an opening provided in sidewall 46. Pressure gauge 52 is operable to sense the vacuum pressure within processing space 102 and provides a pressure feedback signal. An exemplary pressure gauge 52 is a capacitance manometer, such as the Baratron® Capacitance Manometer manufactured by MKS Instruments (Andover, Mass.). A bleed valve 54 is connected via tubing 55 to another opening provided in sidewall 46. Bleed valve 54 is operable to vent processing chamber 12 with ambient air or a supplied gas, such as nitrogen.

Referring to FIG. 3, plasma treatment system 10 is connected for fluid communication with a vacuum pumping system 134 through a large, centrally located exhaust port 136 in bottom wall 44 of chamber base 18. Vacuum pumping system 134 includes a conical reducing nipple 138, a vacuum valve 140, an exhaust vacuum conduit (not shown), and a vacuum pump 144.

Opposing ends of conical reducing nipple 138 carry a first vacuum flange 146 and a second vacuum flange 166. First vacuum flange 146 is connected to exhaust port 136 via a screened centering ring 148 circumscribed by O-ring 150 and a plurality of bulkhead clamps 152. Bulkhead clamps 152 are symmetrically disposed about the periphery of first vacuum flange 146. Each bulkhead clamp 152 has a tapered segment 154 that is adapted to engage a complementary lower surface of first vacuum flange 146 and a block portion 156 that further includes bores (not shown) for removably receiving fasteners 160. Preferably, fasteners 160 are threaded bolts attachable to openings having complementary internal threads (not shown) in bottom wall 44. To create a vacuum-tight seal, fasteners 160 are tightened to a preselected torque in a patterned sequence so as to uniformly compress O-ring 150.

Vacuum valve 140 carries an upper vacuum flange 162 connected for fluid communication via a vacuum fixture 164 with second vacuum flange 166 which is carried by conical reducing nipple 138. Vacuum fixture 164 comprises a removable clamshell clamp 168 with a wingnut closure 170 and a through-bore centering ring 172. When wingnut closure 170 is tightened, an O-ring 174 carried by centering ring 172 is compressed to created a vacuum-tight seal. Vacuum valve 140 also is further connected for fluid communication with vacuum pump 144.

Vacuum pump 144 may comprise one or more vacuum pumps as would be apparent to one of ordinary skill in the art of vacuum technology. A preferred vacuum pump 144 is a single rotary-vane vacuum pump of the type manufactured by, for example, Alcatel Vacuum Technologies Inc. (Fremont, Calif.), that has a pumping rate of about eleven cubic feet per minute and which, due to the high conductance of processing chamber 12, can evacuate processing space 102 to a vacuum pressure of about 200 mTorr in less than about six seconds. Alternative vacuum pumps 144 include dry pumps and turbomolecular pumps.

In another aspect of the present invention, a vacuum distribution baffle 180 is positioned on a shoulder 178 on the interior of chamber base 18. Vacuum distribution baffle 180 is a flat elongate plate 182 perforated by a plurality of orifices 184. Orifices 184 restrict the flow of process gas toward the inlet of vacuum pumping system 134 so as to divert the pressure differential. As a result, the entire processed surface of workpiece 56 will be uniformly exposed to the plasma while simultaneously allowing high-speed evacuation of process gas and sputtered contaminant species during a plasma processing operation. Vacuum distribution baffle 180 also prevents gas flow to vacuum pump 144 from disturbing the position of workpiece 56 upon substrate support 64.

Preferably, vacuum distribution baffle 180 is formed of an electrically-insulating material, such as a machinable ceramic, having a minimal out-gassing potential. Suitable machinable ceramics include an aluminum oxide or a glass-bonded mica composite, such as Mykroy/Mycalex® or Macor®.

In one aspect of the present invention, chamber lid 14 integrates a gas distribution system that is configured to symmetrically and evenly distribute the flowing stream of process gas over the surface of workpiece 56. Specifically, ceiling 28 of chamber lid 14 includes an embedded cavity 186, a process gas inlet port 190, and a plurality of apertures 192. As best shown in FIG. 2C, gas inlet port 190 is positioned in chamber lid 14 and is coupled via gas line 194 to a gas manifold 308 (FIG. 4) for providing a process gas to processing space 102. As best shown in FIG. 3, the vacuum side of ceiling 28 includes apertures 192 for injecting process gas from cavity 186 into processing space 102. Preferably, apertures 192 are symmetrically distributed in a two dimensional array about the longitudinal axis of processing chamber 12 so that process gas will flow uniformly over the surface of workpiece 56, and therefore, contribute to improving plasma uniformity.

In another aspect, chamber base 18 further includes a power distribution system that transfers electrical power from a plasma excitation source, such as radio-frequency (RF) generator 302 (FIG. 4), to ionize and dissociate the process gas confined within processing space 102. The power distribution system includes a power distribution bar 198 operably connected to the RF generator 302, a pair of power feedthroughs 200a,b, a bottom electrode 202, and substrate support 64. The RF generator 302 is operably connected by feedthroughs 200a,b to the substrate support 64, which serves as a powered electrode for capacitively coupling excitation energy with the process gas in processing chamber 12 to initiate and sustain a plasma in processing space 102. Chamber lid 14 and chamber base 18 collectively form an unpowered, ground electrode.

Floor wall 44 of chamber base 18 further includes two openings 204 that receive power feedthroughs 200a,b. A circular groove 208 is concentrically disposed about the central, longitudinal axis of each opening 204 for receiving an O-ring 210 therein. Each of the power feedthroughs 200a,b includes an electrical tie rod 212 coaxially surrounded by a shield insulator washer 214, a chamber insulator washer 216, and a bottom insulator washer 218. Preferably, washers 214, 216, 218 are composed of a gas-impermeable ceramic dielectric, such as quartz or alumina, and each tie rod is formed of an electrical conductor, such as copper, aluminum, or alloys thereof. Power feedthroughs 200a,b are electrically isolated from processing chamber 12.

Electrical tie rod 212 includes a flanged head 222 and an opposed threaded end 226. Flanged head 222 is received within a complementary recess 228 disposed in the upper surface of bottom electrode 202 for electrical continuity therewith and mechanical securement to inhibit downward movement. Tie rod 212 extends downward through the central bores in shield insulator washer 214, chamber insulator washer 216, and bottom insulator washer 218. Threaded end 226 protrudes beyond bottom wall 44 for connection with the excitation power supply.

Bottom insulator washer 218 includes an annular lower portion 232 of a first outer diameter continuous with an annular upper portion 234 of a lesser second outer diameter. Upper portion 234 is received within opening 204 so that an upper surface of lower portion 232 abuts O-ring 210 for a vacuum-tight seal with the non-vacuum surface of floor wall 44. A frustoconical portion 236 of bore 230 is adapted to receive an O-ring 238. Frustoconical portion 236 is sized and configured so that O-ring 238 can be compressed via fastener 239 to provide a vacuum seal between the circumference of tie rod 212 and bottom insulator washer 218.

Shield insulator washer 214 is interposed between the lower surface of bottom electrode 202 and the upper surface of vacuum distribution baffle 180. Shield insulator washer 214 includes an annular lower portion 242 of a first diameter integral with an annular upper portion 244 of a greater second outer diameter. Upper portion 244 abuts vacuum distribution baffle 180 and lower portion 242 protrudes downward into an opening therein.

Chamber insulator washer 216 is interposed between the inner, bottom surface of the chamber base 18 and the lower surface of the vacuum distribution baffle 180. Chamber insulator washer 214 has opposed parallel surfaces 248, 250. Surface 248 includes a first recess that is adapted to fit over a length of upper portion 234 of bottom insulator washer 218. Opposed surface 250 includes a second recess of a diverse diameter that receives a length of lower portion 242 of chamber insulator washer 216.

Fastener 239 has a threaded bore adapted to mate with the threaded end 226 of tie rod 212. When fastener 239 is tightened, an upper surface of bottom insulator washer 218 compressively engages O-ring 210 and is urged upwardly thereagainst to create a vacuum-tight seal between the exterior of the chamber base 18 and bottom insulator washer 218. An upper surface of fastener 239 compressively engages O-ring 238 disposed in frustoconical taper 234 to create a vacuum-tight seal between the circumference of tie rod 212 and the inner diameter of bottom insulator washer 218.

Power distribution bar 198 is attached to threaded end 224 of tie rod 212 by two fasteners 256, 258. The top surface of bottom electrode 202 engages the lower surface of substrate support 64 in close contact so as to provide electrical continuity. Therefore, electrical power applied to the power distribution power 198 is transferred via tie rod 212 to substrate support 64, which itself functions as a portion of the powered electrode. Bottom electrode 202 and substrate support 64 are preferably formed of an electrically-conductive material, such as aluminum. In an alternative embodiment, bottom electrode 202 may be composed of a ceramic such that substrate support 64 alone constitutes the powered electrode.

Vacuum distribution baffle 180, described in detail above, also functions as a plasma shield that reduces the RF field strength between the underside of bottom electrode 202 and chamber base 18. As a result, the plasma will be intensified near the surface of the workpiece 56 held by substrate support 64 and the power and time to perform a plasma treatment each workpiece 56 will be minimized. Further, the configuration of powered and ground electrodes produce an electric field substantially perpendicular to a workpiece 56 residing on substrate support 64 such that ion trajectories are substantially perpendicular to the surface normal of the workpiece 56.

Workpiece 56 is advantageously positioned in processing chamber 12 having a vertical position substantially in a plane half-way between the ceiling 28 of chamber lid 14 and the top surface of support platform 68. Relative to known plasma treatment systems, minimization of the volume of chamber 12 for a high pumping rate and precise positioning of workpiece 56 permit rapid plasma processing at a reduced power level.

Figure 4:
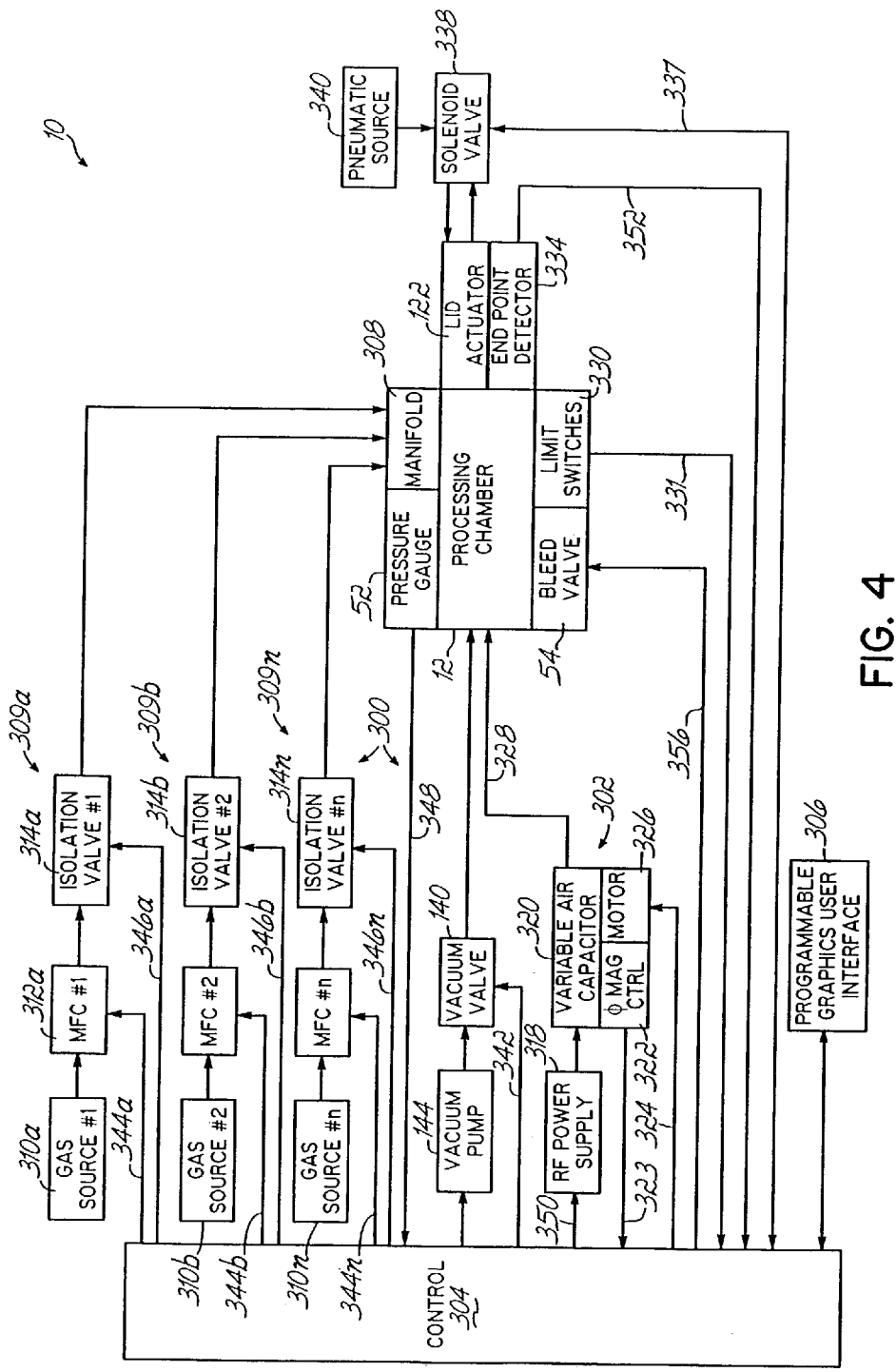
FIG. 4 is a schematic block diagram illustrating a control system for the plasma treatment system of FIG. 1.

Referring to FIG. 4, the plasma treatment system 10 includes a gas flow control 300 and an RF generator 302 connected to the processing chamber 12. A treatment system control 304 receives input signals from various devices within the plasma treatment system 10 and provides output signals to operate the gas flow control 300 and RF generator 302. The control 304 is also connected to a programmable graphics user interface 306. The interface provides user input devices, for example, pushbuttons, switches, etc., and further, has output devices, for example, lights and a display screen, thereby allowing the user to follow the status of the operation of the plasma treatment system 10 and control its operation. The control 304 may be any type of microprocessor based control having both logic and arithmetic capabilities. For example, a programmable logic controller such as Model Direct Logic 205 manufactured by Koyo and commercially available from Automation Direct of Cummings, Ga. Further, the graphics user interface 306 is also manufactured by Koyo for the Direct Logic 205 and is also commercially available from Automation Direct.

Normally, during a plasma processing operation within the processing chamber 12, a plurality of process gases are mixed within a manifold 308. Exemplary process gases include Ar, He, $CO_2$, $N_2$, $O_2$, $CF_4$, $SF_6$, $H_2$, and mixtures thereof. Each process gas has an independent gas supply system 309 comprised of a gas source 310, a mass flow controller 312, an isolation valve 314 and a solenoid valve 315. In the example where two gases, for example, Ar and $O_2$, are used, there would be two independent gas supply systems 309a, 309b comprised of gas sources 310a, 310b, mass flow controllers 312a, 312b, isolation valves 314a, 314b and solenoid valves 315a, 315b. As will be appreciated, any number of additional gas supplies 309n may be connected to the manifold 308 and each additional gas will have its own gas source 310n, mass flow controller 312n, isolation valve 314n and solenoid valve 315n.

In addition to independent gas supplies, the gas flow control 300 includes vacuum pump 144, vacuum valve 140, solenoid valve 341 and pressure gauge 52. The plasma treatment system 10 is highly responsive to changes in processing parameters. Therefore, pressure gauge 52 is placed in close proximity to the chamber 12 and is fluidly connected to the chamber 12 with tube 55 of an advantageously large diameter, for example, a 0.500 inch diameter tube. The gas flow control 300 further includes bleed valve 54 and its solenoid 357 for bringing the processing chamber 12 back to atmospheric pressure at the end of a plasma processing cycle. Again, to minimize the depressurization process, bleed valve 54 is normally in close proximity to the processing chamber 12 and has a relatively large fluid communication opening therewith. Thus, the bleed valve 54 has the capability of returning the processing chamber 12 to atmospheric pressure in approximately one second.

The RF generator 302 is comprised of an RF power supply 318 providing RF power to an L-network tuner or impedance matching device 320, for example, a pair of variable air capacitors. RF power supply 302 operates at a frequency between about 40 kHz and about 13.56 MHz, preferably about 13.56 MHz, and a power between about 0 watts and about 600 watts, preferably about 60 watts to about 400 watts. RF power from the variable air capacitors 320, 324 is applied over an output 328 to substrate support 64 (FIG. 3) within the processing chamber 12. A phase capacitor 320 includes a movable plate connected to a motor 321 and further has a phase control 322 that provides an analog feedback signal on an input 323 of the control 304. A magnitude capacitor 324 has a movable plate connected to a motor 325 and further has a phase control 326 that provides an analog feedback signal on an input 327 of the control 304. The control 304 utilizes a known PID control loop to provide analog command signals on outputs 328, 329 to the respective motors 321, 325 to move the plates of the variable air capacitors 320, 324 in a known manner.

The PID control loop of the present invention utilizes a control algorithm that automatically provides a variable gain to improve performance at the boundary conditions. The magnitude of the feedback signal on the input 323 has a range of from −5 volts to +5 volts; and with a constant gain system, as the magnitude of the feedback signal moves close to and through the zero crossing, accurate and stable system control is difficult. Traditionally, the gain is set to a fixed value that is a compromise between that needed to handle lower signal levels while not letting the control system saturate at higher signal levels. The result is a generally compromised or lower level of system responsiveness and performance, that is, the time required for the control system to stabilize is longer. The present invention continuously recalculates, and dynamically sets, a gain value as a function of the signal strength of the feedback signal on the input 323. Thus, the PID loop is critically damped, that is, it reaches a stable state quickly with a minimum of overshoot. In other respects, the tuning network 320 functions in a known manner to match an impedance of an RF system comprised of an RF output of the RF power supply 318, the tuning network 320 and the RF load presented by the RF circuit within the processing chamber 12 to a desired impedance value, for example, 50 ohms.

As will be appreciated, various limit or proximity switches 330 are utilized in association with the operation of the processing chamber 12. For example, limit switches are utilized to detect the respective opened and closed positions of chamber lid 14 (FIG. 1) of the processing chamber 12 and provide a state feedback signal on a respective input 331 of the control 304. Those limit switches may be connected to the lid actuator 122 (FIG. 2C) operating the lid 14, may be mounted on the lid 14, or otherwise detect the position of the lid 14. A proximity switch is also used to detect the desired position of a workpiece 56 within the processing chamber 12. There are many different commercially available limit switch devices that utilize magnetism, mechanical contact, light, etc., to detect the proximity or position of an object. The choice of a particular type of commercially available limit switch is dependent on the application and preference of the designer.

An end point of a plasma processing cycle may be determined in several ways. The plasma treatment system of the present invention has a very high level of control; and therefore, the plasma processing cycle is highly repeatable. Hence, with the plasma treatment system of the present invention, the control 304 normally utilizes an internal timer to measure the duration of the plasma processing cycle. In some applications, an end point detector 334 is operatively connected with the processing chamber 12. The end point detector 334 is normally a photoelectric switch that changes state in response to detecting a desired and particular wavelength of the light of the plasma generated within the processing chamber 12. Visual communication between the end point detector 334 and the interior of the processing chamber 12 may be achieved by directing the end point detector 334 through the viewport 34 (FIG. 1) or mounting the end point detector 334 within an opening or hole (not shown) in a wall of the processing chamber 12. Creation of the gas plasma within the processing chamber 12 produces light. Further, the wavelength of that light changes with the composition of the different materials within the gas plasma in the chamber 12. For example, with an etching process, as the gas plasma etches different materials from the surface of the workpiece, the wavelength of the light created by the plasma will be a function of a combination of the gas plasma and atoms of those materials. After any coatings and impurities have been etched from the surface, continued etching will result in a combination of atoms of the native material of the workpiece and the gas plasma. That combination produces a unique wavelength of light which is detected by the end point detector 334, and the detector 334 provides a binary feedback signal on an output 336 back to the control 304. Thus the control 304 is able to detect when the plasma processing cycle is completed when that feedback signal changes state.

Figure 5:
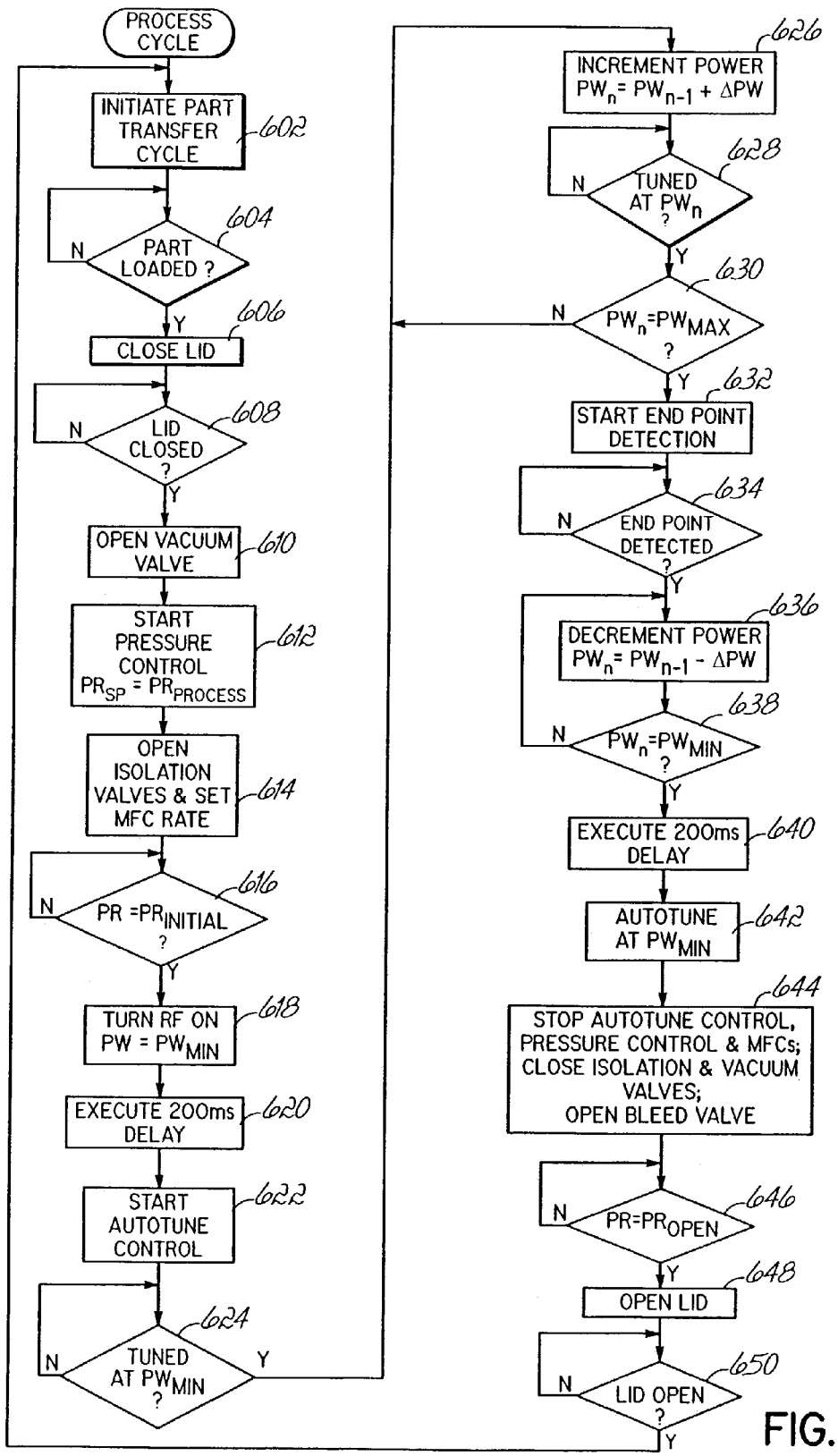
FIG. 5 is a flow chart illustrating a process of implementing a plasma processing cycle utilizing the control system of FIG. 4.

FIG. 5 is a flowchart illustrating the operation of the control 304 in implementing a typical plasma processing cycle. At 602, a part transfer cycle is initiated. During that process, the control 304 provides command signals to a controller (not shown) that causes the positioning lever 94 to move an unprocessed workpiece 56 into the chamber 12 between the side rails 78a,b. As the part 56 is moved into position, one of the limit switches 330 detects the loaded position of the part and provides a state feedback on a respective output 331 to the control 304. Upon the control, at 604, detecting a change in the switch state indicating that the part is loaded, the control 304 provides a command signal on an output 337 to open a solenoid valve 338. The open solenoid 338 directs pressurized air from a pneumatic source, for example, shop air, 340 to the lid actuator 122 in a direction causing the lid actuator 122 to move the lid 14 to its closed position. One of the limit switches 330 detects the closed position, changes state and provides a state feedback signal on a respective input 331 to the control 304.

Upon detecting the lid closed position, at 608, the control 304 then, at 610, provides a signal over an output 342 commanding the solenoid 341 to open the vacuum valve 140. Simultaneously, at 612, the control 304 establishes a pressure set point equal to $PR_{PROCESS}$ and initiates operation of a process pressure monitor. Normally, in a plasma treatment system, the chamber 12 is evacuated to a desired and fixed partial vacuum pressure prior to the start of a plasma processing cycle. However, the initial evacuation of the chamber 12 is a time consuming process. Applicants discovered that high quality plasma processing can be undertaken within a range of pressures above and below a normally used processing pressure within the chamber 12. The permissible pressure range has been determined by processing many parts under different conditions within the chamber 12. Thus, with the plasma treatment system of the present invention an upper pressure boundary limit, for example, 250 mTorr, is determined by adding an offset pressure, for example, 50 mTorr, to the normally used processing pressure, for example, 200 mTorr. Further, a lower pressure boundary limit, for example, 150 mTorr, is determined by subtracting the offset pressure, for example, 50 mTorr, from the normally used processing pressure, for example, 200 mTorr. In this example, the pressure monitor system establishes the normally used processing pressure of 200 mTorr as the pressure set point, but the pressure monitoring system will not set an alarm or otherwise impact the operation of the plasma treatment process as long as the pressure remains between the upper and lower boundary limits of 250 mTorr and 150 mTorr, respectively. Therefore, as long as the vacuum pump 144 is running, the control 304 is monitoring the input 348 which is providing a pressure feedback signal from the pressure gauge 52. When the control 304 detects that the chamber 12 is evacuated to 250 mTorr, the gas plasma is started.

Simultaneously with starting the pressure monitor at 612, the control 304, at 614, provides command signals over the outputs 344, 346 to operate respective mass flow controllers 312 and isolation valves 314. Process gas is introduced through process gas inlet port 190 at a predetermined flow rate, such as 5–100 standard cubic centimeters per minute ("sccm") for Ar. The flow rate of gas provided by the mass flow controllers 312 and the pumping rate of the vacuum pump 144 are adjusted to provide a processing pressure suitable for plasma generation so that subsequent plasma processing may be sustained. Processing pressures within the chamber 12 are typically on the order of 50 to 1000 mTorr and preferably in the range of 125 to 250 mTorr. In contrast to prior systems, the processing chamber 12 is continuously evacuated simultaneously with the introduction of the process gases which are initially used to purge ambient air from the chamber 12. In one embodiment, the mass flow controllers 312 are operated to provide a flow rate of 30 sccm to the processing chamber which has a volume of approximately 0.50 liters. Thus, fresh gases are exchanged within the processing chamber 12 approximately four times per second. More traditional plasma treatment systems exchange the gas in the processing chamber approximately once every five seconds. The higher gas flow rate of the system of the present invention improves the removal of etched materials and other contaminants from the processing chamber and also minimizes the deposition of etched materials on the walls and tooling within the chamber 12.

The control 304 continuously monitors the feedback signal on the input 348 from the pressure gauge 54 which is continuously measuring the pressure or partial vacuum within the processing chamber 12. At 616, the control 304 detects when the pressure in the processing chamber 12 is equal to an initial pressure, that is, the normally used processing pressure plus the offset pressure value, which, in the example above is 250 mTorr. The control then, at 618, provides a command signal on an output 350 to turn on the RF power supply 318. However, instead of providing full power from the RF power supply 318, the control 304 commands the RF power supply to supply only a minimum power level, for example, 30 watts. Traditional plasma treatment systems initially apply full power to the processing chamber 12 via the tuning network 320. Creating the gas plasma at full power often results in plasma spikes, electric arcs, energy hot spots, other anomalies and a very unstable gas plasma. Further, since changes in the gas plasma result in a different RF load in the processing chamber 12, the unstable gas plasma makes it very difficult for the tuning network 320 to match the impedance of the RF system to a desired value. Consequently, by initially creating the gas plasma at full RF power, a substantial amount of time is consumed waiting for the plasma to stabilize within the processing chamber 12 and thereafter, operating the tuning network 320 until the desired impedance match is established. With the plasma treatment system of the present invention, initially applying a lower or minimum level of power, for example, 30 watts, to the system permits the plasma in the chamber 12 to stabilize very quickly when compared to traditional systems.

After turning on the RF power supply 318 to the minimum power level, the control 304, at 620, executes a 200 millisecond delay. This delay period permits the plasma at the minimum power level to stabilize. Thereafter, at 622, the control 304 initiates the operation of an automatic tuning cycle or autotune control by which the variable air capacitors are used to match the RF impedance of the output of the power supply 318 and the RF impedance of the input of the processing chamber 12 to a desired impedance, for example, 50 ohms. During that process, analog feedback signals from the phase magnitude controls 322, 326 are provided on respective inputs 323, 329 of the control 304. The control executes a PID control loop and provides command signals on the outputs 328, 329 to operate the respective motors 321, 325 such that the variable air capacitors 320, 324 provide the desired impedance match.

The control then, at 624, determines whether the tuning network 320 has achieved the desired impedance match. When that occurs, the control 304, at 626, begins to ramp the power from its minimum level to a maximum level; and as the power is increased, the control, at 628, continues to operate the tuning network 320 with each successive power level. Thus, as the control moves from its minimum power level to the maximum power level, the variable air capacitor 320 is continuously adjusted so that the impedance presented to the RF power supply 318 remains matched to the desired 50 ohm load. Applicants have discovered that by maintaining the impedance match while ramping the RF power up to the maximum level, a stabilized gas plasma is achieved at full power in less time than if the RF power supply 318 were initially turned on to its maximum power level and the impedance matching operation executed.

It should be noted that as the power is ramping up to its maximum level, the process gases are flowing through the processing chamber 12 at their desired flow rates and the vacuum pump 144 is continuing to depressurize the processing chamber. As previously described, a range of operating pressure was determined by processing many workpieces using different process parameters. Using similar empirical methods, the maximum rate at which RF power can be increased while maintaining a tuned RF system was also determined; and that maximum rate of RF power increase provides a reduced plasma treatment cycle.

If the control 304, at 630, determines the RF power is not at its maximum level, the control, at 628, again increments the power level and operates the tuning network 320 to match the impedance to the desired value. If, at 630, the control 304 determines that the power is now at its maximum value, the control then, at 632, begins monitoring for an endpoint of the plasma treatment cycle while the power remains at its maximum value and the plasma treatment process continues. During a plasma treatment operation, contaminant species sputtered from the surface of workpiece 56 will be evacuated from processing space 102 via exhaust port 136 along with the flowing stream of process gas. Plasma treatment system 10 is optimized to enhance both the spatial uniformity of plasma treatment and system throughput.

The control 304, at 634, checks the state of the feedback signal on the input 352 from the end point detector 334 to determine whether the plasma processing cycle is complete. In the described embodiment, the endpoint of the processing cycle is determined by the endpoint detector 334 detecting a particular wavelength of light of the plasma and providing a signal representing such to the control 304. As will be appreciated, by processing a large number of workpieces using different processing parameters, the amount of time required to process a workpiece can be determined. In an alternative embodiment, the control 304 can start an internal timer at the same time that the autotune control is started at 622. The timer is set to the amount of time required to process a workpiece as was empirically determined. Therefore, when the internal timer expires indicating an end of the plasma processing cycle, the control at 304 detects the expiration of the timer as the endpoint of the plasma treatment cycle.

Upon the control, at 634, detecting a state of the end point feedback signal on the input 352 representing an end of the plasma treatment cycle, the control 304, at 636, provides a command signal on its output 350 to cause the RF power supply 318 to decrement or ramp down the RF power from its maximum level to its minimum level. Normally, the power is ramped down from its maximum level to its minimum level at the same rate and thus, over an identical time period, as is required to ramp the power up from its minimum level to its maximum level. Upon the control 304 detecting, at 638, that the RF power supply 318 is providing power at the minimum level, the control 304 then, at 640, the control 304 checks that the RF system is tuned at the minimum power level. Thereafter, at 642, the control 304 turns off the autotune control and executes a 200 millisecond delay which permits the plasma at the minimum power level to stabilize.

Traditional plasma processing cycles simply turn the RF generator off at the end of a processing cycle, and the tuning network is in a state corresponding to a processing power output from the RF power supply. Hence, when the next cycle is started, which may be at a different power level, some time is required to for the tuning network 320 to match the impedance. In contrast, with the present invention, at the end of a cycle, the tuning network is tuned to minimum power. Thus, at the start of the next processing cycle, when the RF power supply 318 is turned on to minimum power, the tuning network 320 is in a state such that, either, the desired impedance match already exists, or it can be quickly tuned to a match. Minimizing tuning of the RF system can result in cycle time savings of up to 15 seconds.

Next, the control 304, at 644, stops the operation of the pressure monitor and provides command signals on the outputs 342 and 346 to cause respective solenoid valves 341 and 315 to close the respective vacuum valve 140 and isolation valves 314. Further, the control 304 provides a command signal on output 344 to terminate the flowrate of gases through the appropriate mass flow controllers 312. In addition, the control 304 provides a command signal over an output 356 to cause solenoid valve 357 to open the bleed valve 54, thereby depressurizing the processing chamber 12. At 646, the control 304 determines that the pressure within the processing chamber 12 is substantially equal to atmospheric pressure. This determination is normally made by the control using an internal timer to measure a period of time required to depressurize the processing chamber 12 with the bleed valve 54. Thereafter, at 648, the control 304 provides a command signal on the output 337 causing the solenoid valve 338 to change state and reverse the operation of the lid actuator 122. Thereafter, at 650, the control 304 detects that the lid 14 is raised to its opened position and initiates a successive part transfer cycle 602. The above process is then repeated for successive workpieces.

Figure 6:
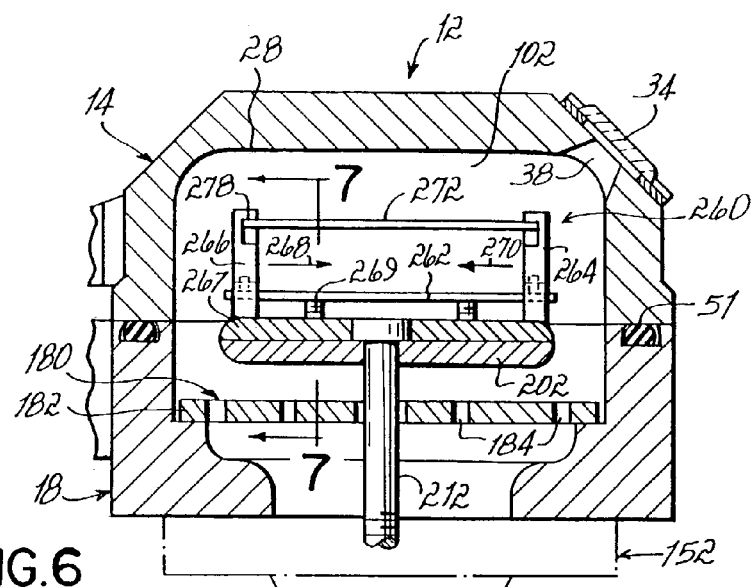
FIG. 6 is a side view of a substrate support in accordance with an alternative embodiment the principles of the present invention.
Figure 7:
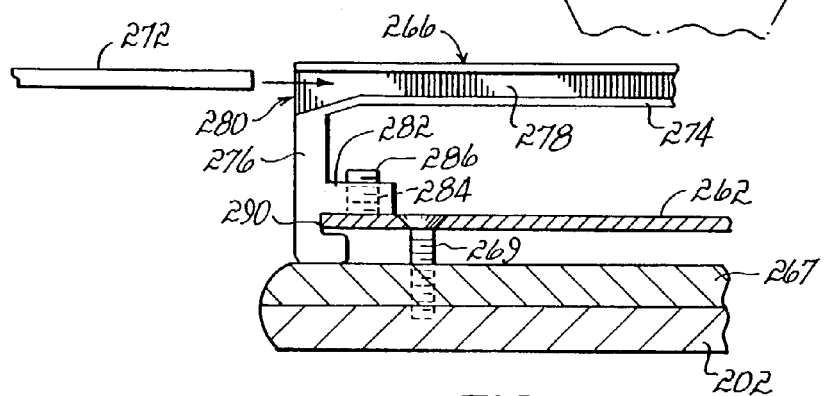
FIG. 7 is a partial front view of the substrate support of FIG. 6.
Figure 8:
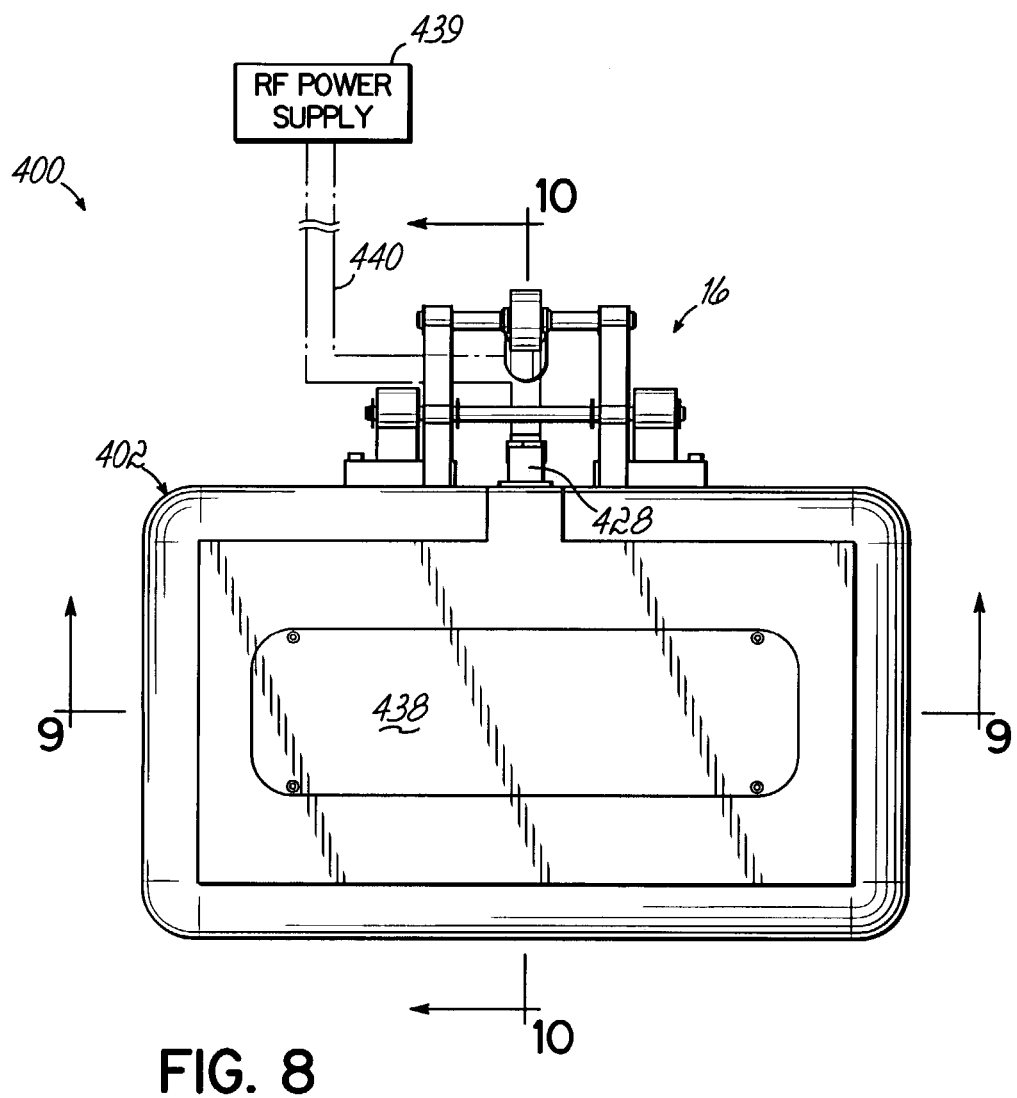
FIG. 8 is a top view of a plasma chamber in accordance with the principles of the invention.

FIGS. 6 and 7 depict an alternative embodiment of the processing chamber 12 according to the principles of the present invention which includes a variable-width substrate support 260. Support 260 advantageously permits workpieces of variable dimension to be received thereon. Referring to FIG. 6, substrate support 260 includes an elevated platform 262 that slideably carries two moveable opposed side rails 264, 266 and a flat plate 267 that is attached to bottom electrode 202 by the downward force applied by each tie rod 212. Elevated platform 262 is mechanically and electrically attached by a plurality of fasteners 269 to flat plate 267. As shown by arrows 268, 270, side rails 264, 266 are moveable between an extreme position near the perimeter of support platform 262 to a central position along the longitudinal axis of elevated platform 262. As a result, the separation distance between sides rails 264, 266 may be varied to accommodate a workpiece 272 of a predetermined transverse width.

Side rail 264 and side rail 266 are identical structures that will be described with reference to side rail 266. Referring to FIG. 7, side rail 266 comprises a horizontal member 274 flanked at each opposed end by an integral vertical post 276. A channel 278 extends longitudinally along the entire length of horizontal member 274 and has a U-shaped cross-section with a predetermined width that accepts a peripheral edge of workpiece 272. Each opposed end of channel 278 includes a flared lip 280 that facilitates slideable capture of side edges of the workpiece 272.

Each vertical post 276 includes an upper prong 282 with a threaded bore 284 for receiving a set screw 286 and a beveled lower prong 288. The lower surface of upper 282 prong is displaced vertically from the upper surface of lower prong 288 to create an indentation 290 of a width that is slightly less than the thickness of elevated platform 262. The indentation 290 slideably receives a peripheral edge of elevated platform 262. Accordingly, each side rail 264, 266 may be independently moved to a predetermined transverse position and affixed with set screw 286.

With reference to FIGS. 8–12 in which like reference numerals refer to like features in FIGS. 1–7 and according to an alternative embodiment of the invention, the plasma treatment system 10 may be provided with a processing chamber 400 including the chamber base 18 and a chamber lid 402 hingeably coupled with the chamber base 18. Specifically, one side of chamber lid 402 is mounted to hinge assembly 16 so that chamber lid 402 may be selectively pivoted or cantilevered relative to chamber base 18 between an open positioned for transferring workpiece 56 into or out of the processing space 102 and a closed position in which the chamber lid 402 makes a sealing contact with chamber base 18. Loading station 20 (FIG. 1) and exit station 22 (FIG. 1) may be used for shuttling workpieces 56 into and out of processing chamber 400 as described herein with regard to processing chamber 12. Chamber lid 402 may be interchanged with chamber lid 14 (FIG. 1) for expanding the capabilities of the plasma treatment system 10. It follows that an existing plasma treatment system having an original chamber lid may be retrofitted with a substitute chamber lid incorporating the inventive aspects of chamber lid 402.

The chamber lid 402 is an assembly that includes a lower sidewall section 404, a domed ceiling section 406, and a medial sidewall section 408 separating the lower sidewall section 404 from the domed ceiling section 406. The sidewall sections 404 and 408 and the domed ceiling section 406 are formed of a material that has a relatively high electrical conductivity, such as an aluminum or aluminum alloy. A compressible elastomeric O-ring seal 401 is provided between a circumferential upper rim of the medial sidewall section 408 and a circumferential lower rim of the upper domed section 406. Another compressible elastomeric O-ring seal 403 is provided between a circumferential lower rim of the medial sidewall section 408 and a circumferential upper rim of lower sidewall section 404. O-ring 51 is compressively captured between a circumferential lower rim of the lower sidewall section 404 and an apron of chamber base 18. The lower sidewall section 404 includes two view port assemblies, of which view port assembly 410 is visible in FIG. 12, for viewing the plasma processes transpiring in the processing space 102 of processing chamber 400.

Provided in a dividing wall 406a of the domed ceiling section 406 separating plasma cavity 442 from a radiofrequency (RF) cavity 472 is a gas port 409. The gas port 409 is configured with a gas fitting 411 that couples a plasma cavity 442 in fluid communication with a gas line 405 extending to a source 407 of a process gas. The gas fitting 411 is coupled with plasma cavity 442 by a gas distribution path including a process gas passageway 413, a pair of process gas passageways 415a,b coupled with process gas passageway 413, and multiple gas passageways 417 extending from gas passageways 415a,b so as to terminate proximate the upper planar surface of a ceramic insulator plate 416. Any suitable process gas or process gas mixture may be provided that is capable of providing free radicals and other reactive species, when excited by RF energy to generate a plasma, appropriate to perform a downstream-type plasma treatment of workpieces 56, as described herein. Typical process gases include $O_2$, $CF_4$, $N_2$ and $H_2$ and may be mixed with an inert gas, such as Ar, to provide a process gas mixture. A gas flow rate suitable for downstream-type plasma treatment in processing chamber 400 generally ranges from about 1 sccm to about 300 sccm and an appropriate pressure in plasma cavity 442 ranges from about 50 mTorr to about 1000 mTorr.

A mass-flow-controlled flow of ambient air from the surrounding environment of processing chamber 400 may be used as a process gas and has been found to be particularly effective in certain applications for removal of surface contamination. Such a downstream-type plasma is expected to contain free radicals, including oxygen-based and nitrogen-based free radicals, derived from hydrogen, oxygen, nitrogen and other primary constituents of air.

With continued reference to FIGS. 8–12, the domed ceiling section 406 of chamber lid 402 is provided with a grounded plate 412 and a powered electrode 414 that defines a powered plane opposite and-generally parallel to grounded plate 412. The grounded plate 412 and the portions of the domed ceiling section 406 surrounding plasma cavity 442 collectively define a ground plane. A rectangular, planar ceramic electrode insulator 416 electrically isolates the powered electrode 414 from the domed ceiling section 406, including grounded plate 412. Plasma cavity 442 is defined in the domed ceiling section 406 as a volume enclosed between the grounded plate 412 and the powered electrode 414. The grounded plate 412 and the powered electrode 414 are each formed of a material having a high electrical conductivity, such as aluminum or an aluminum alloy.

Grounded plate 412 includes a plurality of openings or throughholes 421 (FIG. 13) having a configuration, dimension, and/or arrangement dependent upon the geometrical shape of the workpiece 56. The throughholes 421 allow the preferential transmission of free radicals, and other process gas species lacking a net charge, from a direct plasma created in plasma cavity 442 to the processing space 102 and prohibit or prevent the transfer of charged species, such as ions and electrons, from the direct plasma residing in plasma cavity 442 to processing space 102. Typically, the grounded plate 412 is effective for removing a significant percentage of the charged species from the plasma admitted from plasma cavity 442 into the processing space 102. The throughholes 421 may present tortuous paths having no line-of-sight paths from the plasma cavity 442 to the processing space 102. The plasma in processing space 102 is a downstream-type plasma that is free, or substantially free, of charged particles for performing plasma treatments of the workpiece 56 by the chemical action of the radicals without the physical action otherwise provided by the charged particles.

The throughholes 421 may be arranged in an array or matrix or may be arranged with non-periodic center-to-center hole spacings. The areal density of throughholes 421 in the grounded plate 412 may range from about ten (10) holes per square inch to about two hundred (200) holes per square inch. The diameter of individual throughholes 421 may range from about 0.001 inches to about 0.125 inches.

Figure 13:
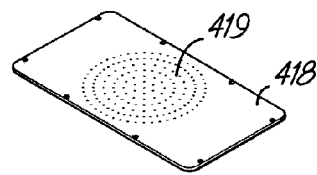
FIG. 13 is a perspective view of an alternative embodiment of a grounded plate for use with the plasma chamber of FIGS. 8–12.
Figure 14:
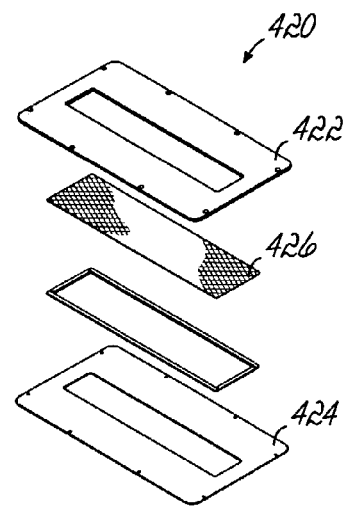
FIG. 14 is a perspective view of an alternative embodiment of a grounded plate for use with the plasma chamber of FIGS. 8–12.

With reference to FIGS. 13 and 14, the chamber lid 402 may be reconfigured using other grounded plates, such as grounded plate 418 (FIG. 13) and grounded plate 420 (FIG. 14). Grounded plates 418, 420 are interchangeable with grounded plate 412 for varying the distribution or pattern of free radicals delivered from the direct plasma in plasma cavity 442 to processing space 102 and, ultimately, delivered to an exposed surface 56a of workpiece 56 supported on substrate support 64. The throughholes 419 in grounded plates 418 and 420 differ in configuration, dimension and/or arrangement from grounded plate 412 for varying the spatial distribution of free radicals admitted from plasma cavity 442 into processing space 102.

Grounded plate 418 includes a plurality of throughholes 419 arranged inside the circular outer periphery of a disk-shaped hole pattern. Grounded plate 418 may be used, for example, to treat semiconductor wafers, such as 300 mm silicon wafers, with a downstream-type plasma. Grounded plate 420 includes two frame plates 422, 424 having a rectangular central opening and a screen or grid 426 captured between frame plates 422, 424 so as to partially occlude the central opening. The screen 426 is a fine wire mesh made from a material with relatively high electrical conductivity, such as aluminum or an aluminum alloy.

The ability to select from among various grounded plates 412, 418 and 420 permits tailoring of the geometrical pattern of radicals delivered from the plasma to the workpiece 56. To that end, the hole pattern of throughholes, such as throughholes 421 of grounded plate 412, can be adjusted to correspond to the geometry of the workpiece 56 being plasma treated with the downstream-type plasma. For example, the throughholes 421 in the grounded plate 412 can be arranged in a disk-shaped hole pattern for processing round workpieces, a square-shaped hole pattern for square workpieces, a rectangular hole pattern for rectangular workpieces, and other geometrical arrangements apparent to persons of ordinary skill in the art as necessary to correspond with the geometrical shape of the workpiece 56. Typically, the throughholes 421 are positioned in the grounded plate 412 so that the peripheral extent of the hole pattern corresponds substantially to the outer peripheral rim or circumference of the workpiece 56.

With reference to FIGS. 8–12, the chamber lid 402 further includes a radio-frequency (RF) bulkhead fitting 428, a pair of ceramic caps 430a,b, a pair of annular ceramic spools 432a,b, a pair of power feedthroughs 434a,b, a power distribution bar 436, and a radio-frequency (RF) lid closure element 438. A radio-frequency (RF) power supply 439 is electrically coupled by a transmission line 440 with the RF bulkhead fitting 428. The RF power supply 439 and the components of the chamber lid 402 collectively provide a plasma excitation source capable of exciting process gas in the plasma cavity 442 to generate a plasma. Power feedthroughs 434a,b transfer RF power from the RF bulkhead fitting 428 and power distribution bar 436 to the powered electrode 414. The RF power supply 439 typically operates at a frequency between about 40 kHz and about 13.56 MHz, preferably about 13.56 MHz, and a power between about 0 watts and about 600 watts, typically about 50 watts to about 600 watts.

Ceramic cap 430a is fastened to the top of power feedthrough 434a and is positioned between power distribution bar 436 and closure element 438. Ceramic spool 432a is captured between the dividing wall 406a and the power distribution bar 436, and power feedthrough 434a extends through the bore of ceramic spool 432a to establish electrical contact between the power distribution bar 436 and the powered electrode 414. Ceramic cap 430b is fastened to the top of power feedthrough 434b and is positioned between power distribution bar 436 and closure element 438. Ceramic spool 432b is captured between the dividing wall 406a, and the power distribution bar 436 and power feedthrough 434b extends through the bore of ceramic spool 432b to establish electrical contact between the power distribution bar 436 and the powered electrode 414. The ceramic caps 430a,b cooperate to electrically isolate the power bar 436 and upper ends of the power feedthroughs 434a,b from the closure element 438. The ceramic spools 432a,b cooperate to electrically isolate the power feedthroughs 434a,b from the dividing wall 406a of domed ceiling section 406. Ceramic spools 432a,b also maintain a small gap in the vertical dimension between the ceramic insulator plate 416 and the dividing wall 406a so that gas flow can occur therebetween.

In use and with continued reference to FIGS. 8–12, process gas enters the chamber lid 402 through the gas fitting 411 and is directed through gas passageways 413, 415a,b to the multiple gas passageways 417 terminating on the upper side of the ceramic insulator plate 416. The process gas flows or seeps around the periphery or perimeter of the powered electrode 414 and the ceramic insulator plate 416 so the flow of process gas is directed toward the outer edges of the domed ceiling section 406. The process gas is attracted laterally by vacuum forces in the processing space 102 about the edges of the ceramic insulator plate 416 and toward the throughholes 421, which promotes uniform process gas distribution in the plasma cavity 442.

The RF energy applied between the grounded plate 412 and the powered electrode 414 ignites and sustains a plasma from the process gas residing in plasma cavity 442. The plasma in plasma cavity 442 is a full direct plasma containing ions, electrons, free radicals and molecular species. Because the flow of process gas in the plasma treatment system 10 is generally conducted toward exhaust port 136 in bottom wall 44, the various components of the direct plasma in plasma cavity 442 will be attracted by a suction or vacuum force toward the throughholes 421 of grounded plate 412. The electrons and ions have a tendency to recombine inside throughholes 421 because grounded plate 412 is grounded relative to earth ground. As a result, the ions and electrons are significantly less likely to enter processing space 102. The grounded plate 412 permits plasma species lacking a net charge, such as free radicals and neutral molecules, to be transported through throughholes 421 into the processing space 102. Typically, the grounded plate 412 is effective for removing substantially all of the charged species from the plasma transferred or admitted from plasma cavity 442 into the processing space 102

The vacuum or the pumping action of vacuum pump 144 (FIG. 3) urges the free radicals and neutral molecules toward the workpiece 56 to perform the downstream-type plasma treatment. The workpiece 56 to be treated with the downstream-type plasma is supported by the side rails 66a, 66b of substrate support 64. Free radicals admitted into processing space 102 contact with the exposed surface 56a of workpiece 56 and react chemically with the material forming the workpiece 56 to perform the surface treatment. Excess free radicals, unreactive process gas molecules, and contaminants removed from the workpiece 56 are exhausted from the processing space 102 by the pumping action of vacuum pump 144.

Chamber lid 402 provides the plasma processing system 10 with various different capabilities in addition to the ability to generate a downstream-type plasma for surface treatments. Because the grounded plate 412 provides a ground plane, substrate support 64 may be energized by RF generator 302 (FIG. 4) to generate a direct plasma in processing space 102. It follows that a plasma treatment system, such as plasma treatment system 10, which is equipped with chamber lid 402, may be used to selectively plasma treat workpieces 56 with either a direct plasma or a downstream-type plasma, as required by the process, so that both capabilities are available in a single system 10.

In an alternative mode of operation, the plasma treatment system 10 can be configured to provide an inverted direct plasma by removing the grounded plate 412, grounding the substrate support 64 to earth ground, and energizing the powered electrode 414 to generate a direct plasma in processing space 102 and plasma cavity 442. With the grounded plate 412 removed, the chamber configuration changes so that the powered plane is provided by powered electrode 414 and the ground plane is provided by the substrate support 64. The inverted direct plasma configuration reduces the process time, under certain circumstances, for improving the plasma treatment of the upper exposed surface 56a of the workpiece 56.

In another mode of operation, the plasma treatment system 10 can be configured to power the powered electrode 414 with the grounded plate 412 removed and, in addition, to energize the substrate support 64, as described herein. In this mode of operation, the RF power provided by RF power supply 439 to electrode 414 is driven 180° degrees out of phase relative to the RF power provided by generator 302 (FIG. 4) to the substrate support 64. As a result, the voltage potential providing the driving force for ionizing the process gas in processing space 102 (FIG. 3) is effectively doubled for an equivalent overall amount of RF power. One potential benefit of this mode of operation is that the RF power applied to substrate support 64 is reduced due to the direct plasma electrons and ions supplied when the powered electrode 414 is energized.

In yet another mode of operation, the plasma treatment system 10 can be configured to power the powered electrode 414 with the grounded plate 412 installed and, in addition, to energize the substrate support 64, as described herein. In this operational mode, the workpiece 56 will be exposed to direct plasma generated in the processing space 102 infused with free radicals from the direct plasma in plasma cavity 442 admitted after filtering of charged particles by grounded plate 412 into processing space 102. According to the principles of the invention, the process gas flowing from process gas source 407 into the plasma cavity 442 may differ from the process gas flowing directly into processing space 102 from an independent process gas source (not shown) so that the free radicals transferred to the processing space 102 through the grounded plate 412 from plasma cavity 442 differ from the species in the direct plasma generated in processing space 102.

According to the principles of the invention and with continued reference to FIGS. 8–12, medial sidewall section 408 is operative for increasing the chamber dimension of the chamber lid 402 in the vertical direction. The chamber dimension in the vertical direction may be reduced by removing the medial sidewall section 408 from the chamber lid 402. Additional medial sidewall sections 408 may be added or stacked between the original medial sidewall section 408 to further increase the height of the chamber lid 402 and to further expand the chamber dimension in the vertical direction. It is further contemplated by the invention that the vertical dimension of the chamber lid 402 may be varied in any of multiple different manners, such as by constructing the medial sidewall section 408 as an expandable vacuum bellows. The lower sidewall section 404 and a domed ceiling section 406 are always present in the assembly forming chamber lid 402 and, when assembled in the absence of the medial sidewall section 408, the dimensions of sections 404 and 406 define a minimum separation between the powered electrode 414 and the exposed surface 56*a* of workpiece 56 confronting the powered electrode 414.

The medial sidewall section 408 is removably mounted to the lower sidewall section 404. Guides 444 are provided to aid in positioning the medial sidewall section 408 relative to the lower sidewall section 404 during installation. Similarly, guides 446 aid the positioning of domed ceiling section 406 relative to the medial sidewall section 408 during installation. Guides 446 may also be used for positioning the domed ceiling section 406 relative to the lower sidewall section 404 if the medial sidewall section 408 is removed from the assembly. Fasteners 448 are utilized for securing the medial sidewall section 408 with the lower sidewall section 404 and for applying a compression force to O-ring 403 to create a vacuum-tight seal. Similarly, fasteners 450 are utilized for securing the domed ceiling section 406 with the medial sideWall section 408 and for applying a compression force to O-ring 401 to create a vacuum-tight seal.

The ability to vary the chamber dimension of processing chamber 400 in the vertical direction by inserting and removing one or more of the medial sidewall sections 408 permits the plasma treatment system 10 to accommodate workpieces 56 of differing thickness. Specifically, a reproducible or predictable distance or separation can be maintained between the powered electrode 414 and the exposed surface 56*a* of the workpiece 56 held by the substrate support 64. To that end, the vertical dimension of each medial sidewall section 408 may be selected to provide a desired separation between powered electrode 414 and exposed surface 56*a*. For example, configuring the chamber lid 402 with two one-inch thick medial sidewall sections 408 will separate the exposed surface 56*a* of a two-inch thick workpiece 56 from powered electrode 414 by the same distance as a one-inch thick workpiece 56 in a process chamber configuration in which the chamber lid 402 has a single one-inch medial sidewall section 408.

The separation between the treated surface of the workpiece 56 and the powered electrode 414 is a fundamental variable that must be controlled for effective plasma treatment with either a direct plasma or a downstream-type plasma in which the treatment uniformity is adequate. It is appreciated that the capability of changing the enclosed volume of the chamber lid 402 and the processing space 102 using one or more of the removable medial sidewall sections 408 is applicable without limitation for both direct plasma and downstream-type plasma treatment systems.

With reference to FIGS. 15–18 in which like reference numerals refer to like features in FIGS. 1–14 and according to an alternative embodiment of the invention, the plasma treatment system 10 may be provided with a processing chamber 500 including the chamber base 18 and a chamber lid 502, similar to chamber lid 402, that is hingeably coupled with the chamber base 18. Chamber lid 502 is mounted to hinge assembly 16 for selectively pivoting or cantilevering relative to chamber base 18 between an open positioned for transferring workpiece 56 into or out of the processing space 102 and a closed position in which the chamber lid 502 sealingly contacts chamber base 18. Chamber lid 502 may be interchanged with chamber lid 14 (FIG. 1) or with chamber lid 402 (FIGS. 8–14) for expanding the capabilities of the plasma treatment system 10 in a manner similar to chamber lid 502 and may be retrofitted to an existing plasma treatment system, such as plasma treatment system 10.

Chamber lid 502 is an assembly including a domed ceiling section 504 having a plasma cavity 542 and a lower sidewall section 506 fastened with the domed ceiling section 504. The domed ceiling section 504 includes a sidewall 501 extending about the periphery of the plasma cavity 542 and a dividing wall 508 separating a radio-frequency (RF) chamber 543 from the plasma cavity 542. Guides 544 (FIG. 16) are used for positioning the domed ceiling section 504 relative to the lower sidewall section 506. A compressible elastomeric O-ring seal 503 is provided between a circumferential lower rim of the domed ceiling section 504 and a circumferential upper rim of lower sidewall section 506. Fasteners 448 are utilized for securing the domed ceiling section 504 with the lower sidewall section 506 and for applying a compression force to O-ring 503 to create a vacuum-tight seal. O-ring 51 is compressively captured between a circumferential lower rim of the lower sidewall section 506 and an apron of chamber base 18 to provide a vacuum-tight seal thereat. The lower sidewall section 506 includes a view port assembly 510 incorporating a site glass that allows an observer to view the plasma processes transpiring in the processing space 102 of processing chamber 500. It is contemplated by the invention that one or more medial sidewall sections (not shown), similar to medial sidewall sections 408 (FIGS. 8–12) described herein, may be introduced between the domed ceiling section 504 and the lower sidewall section 506.

With continued reference to FIGS. 15–18, a gas line 505 couples a process gas source 507 (FIG. 16) via a gas fitting 511 with a gas port 509 provided in the domed ceiling section 504. The gas port 509 is coupled in fluid communication with plasma cavity 542 defined in chamber lid 502 by a gas distribution path that includes a process gas passageway 513 and a gas distribution baffle 546 defining a gas distribution chamber 515 coupled in fluid communication with process gas passageway 513. The gas distribution chamber 515 is coupled in fluid communication with the plasma cavity 542 by a distributed arrangement of multiple gas outlets 517 in the gas distribution baffle 546. The gas outlets 517 may assume any dimensions or arrangement to provide a gas load suitable for tailoring the plasma admitted into processing space 102 for plasma treating different types and configurations of workpieces 56. Any suitable process gas or process gas mixture may be provided to plasma cavity 542 that is capable of providing free radicals and other reactive species, when excited by RF energy to generate a direct plasma in plasma cavity 542, appropriate to perform a downstream-type plasma treatment of workpieces 56, as described herein. The invention contemplates that the gas distribution baffle 546 may be omitted and that the flow of process gas may enter the plasma cavity 542 through the outlet of process gas passageway 513. To that end, the outlet of process gas passageway 513 may be positioned to approximately coincide with the geometrical center of the domed ceiling section 504.

The domed ceiling section 504 is provided with a grounded plate 512 and a powered electrode 514 spaced vertically from the grounded plate 512. The powered electrode 514 defines a powered plane in the plasma cavity 542 that is opposite and generally parallel to the grounded plate 512. The grounded plate 512 has a good electrical contact with sidewall 501 that electrically grounds grounded plate 512 as the chamber lid 502 is grounded. The grounded plate 512 and the portions of the domed ceiling section 504 surrounding plasma cavity 542 collectively define a ground plane. The grounded plate 512 and the powered electrode 514 are each formed of a material having a high electrical conductivity, such as aluminum or an aluminum alloy.

With continued reference to FIGS. 15–18, grounded plate 512 is an assembly that includes an upper slotted plate 516, a center slotted plate 518, and a lower slotted plate 520. The plates 516, 518, and 520 are of substantially equal thickness, although the invention is not so limited. The upper slotted plate 516 is perforated with multiple openings or slots 522 having a major axis extending transversely to a machine direction, into and out of the plane of the page of FIG. 16, in which workpieces 56 are transported from loading station 20 to substrate support 64 and from substrate support 64 to exit station 22. Similarly, the center and lower slotted plates 518, 520 are each perforated with multiple openings or slots 524, 526, respectively, each having a major axis extending transversely to the machine direction for workpiece transport. The cross-sectional profile of each of the slots 522, 524, 526, when viewed vertically, may be any shape having a major axis aligned transverse to the machine direction and, in particular, may be either rectangular or oval.

Figure 15A:
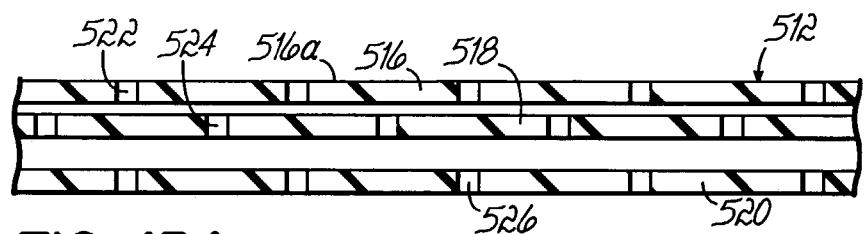
FIG. 15A a detailed view of a portion of FIG. 15.
Figure 9:
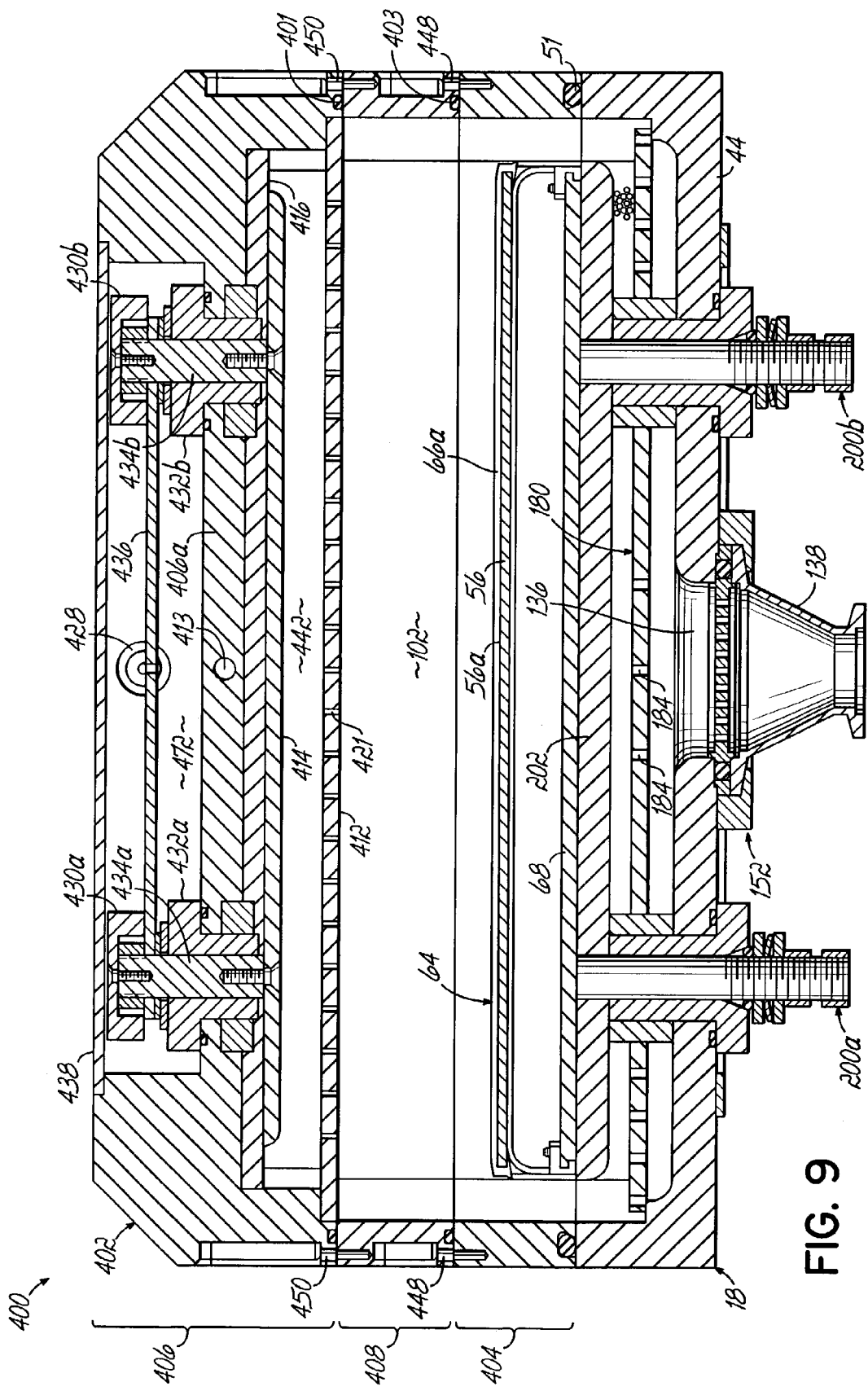
FIG. 9 is a sectional view taken generally along line 9—9 of FIG. 8.
Figure 10:
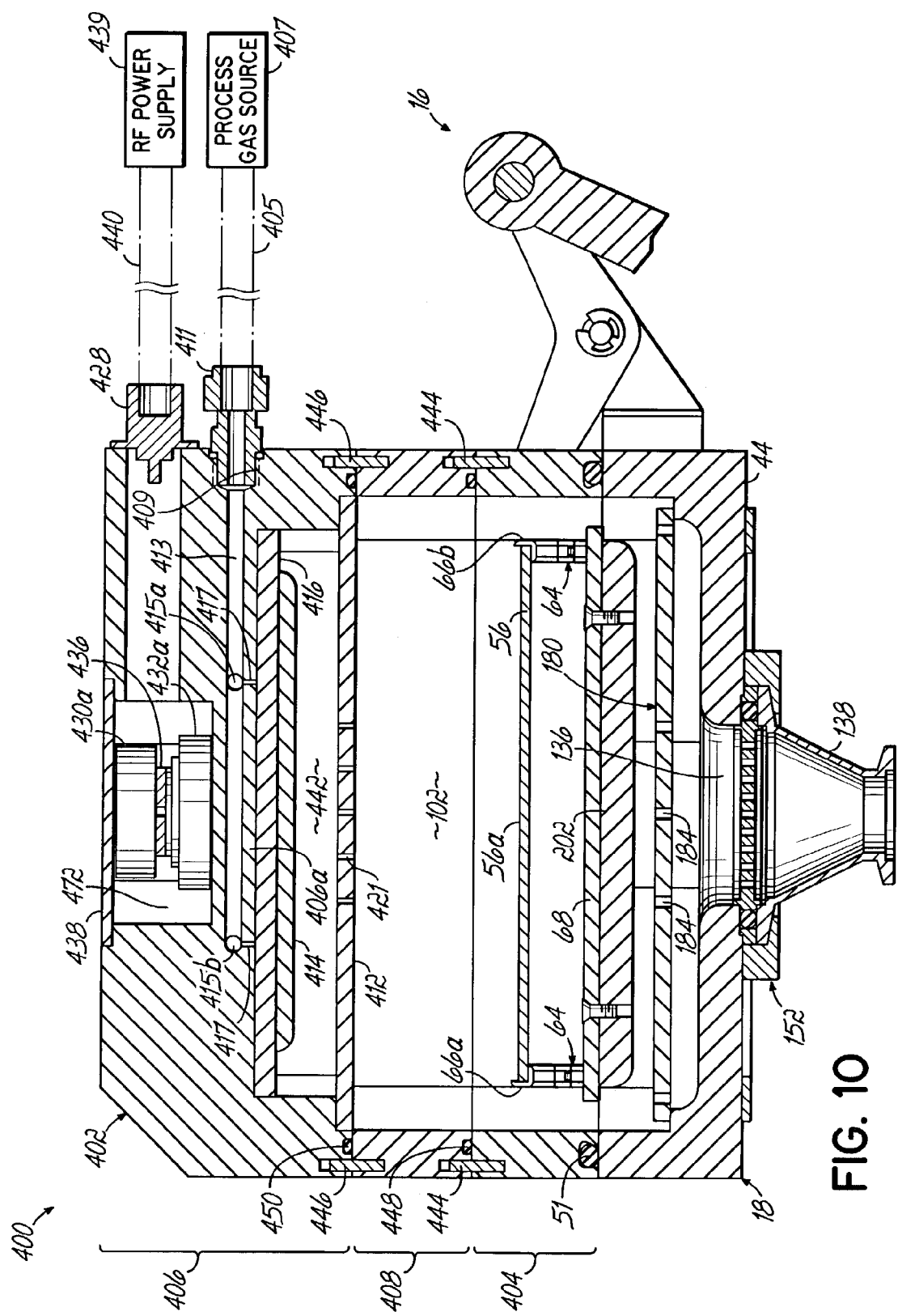
FIG. 10 is a sectional view taken generally along line 10—10 of FIG. 9.
Figure 11:
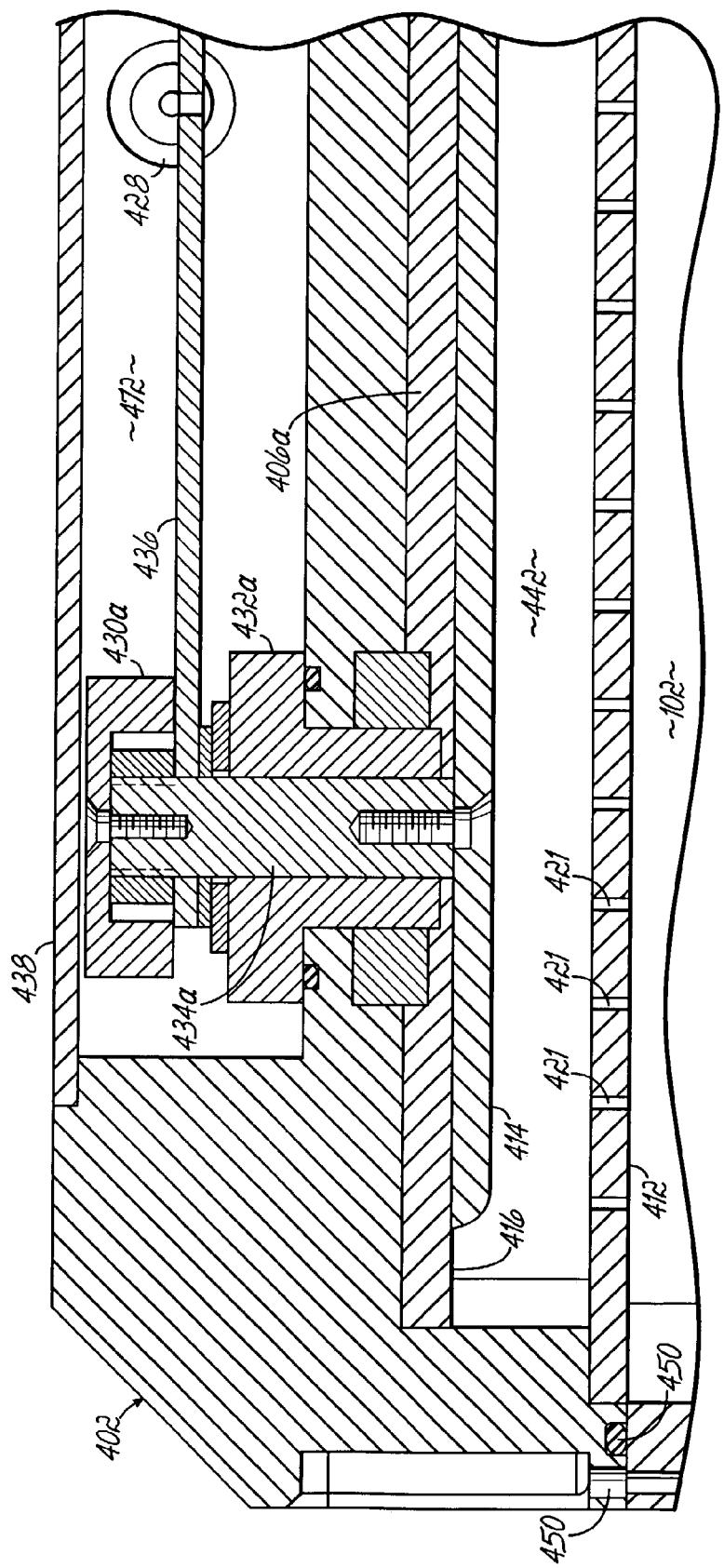
FIG. 11 is a detailed view of a portion of FIG. 10.
Figure 15:
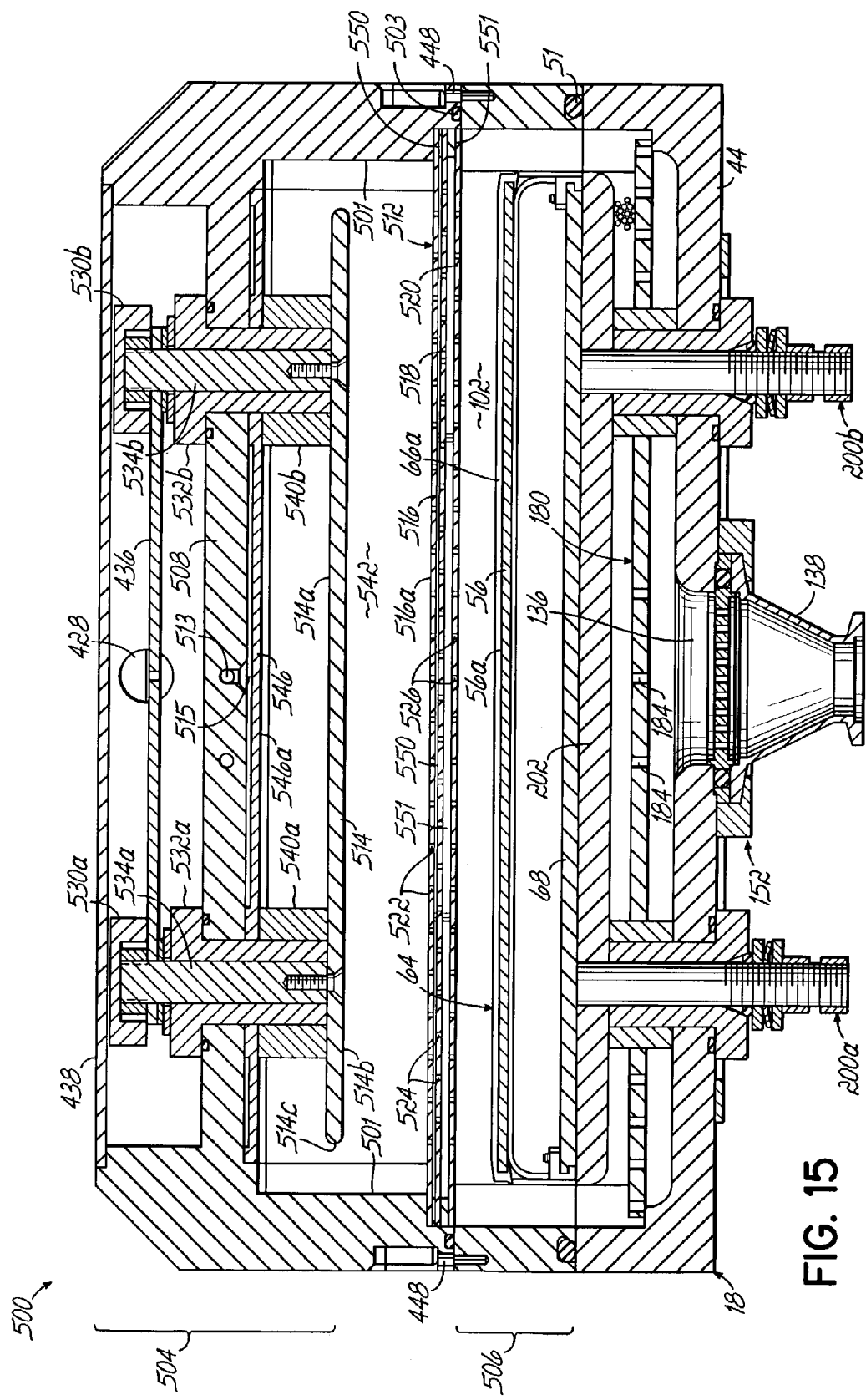
FIG. 15 is a sectional view similar to FIG. 9 of an alternative embodiment of a plasma chamber in accordance with the principles of the invention.

With reference to FIGS. 15 and 15A, slots 522 and 526 of the upper and lower slotted plates 516 and 520, respectively, are aligned vertically. The slots 524 of the center slotted plate 518 are offset from slots 522 and 526 in the machine direction. The slots 522, 524, and 526 permit a fluid flow of process gas and radicals from the plasma cavity 542 to the processing space 102, but present a tortuous or labyrinthine path that substantially eliminates all line-of-sight paths from the processing space 102 to the plasma cavity 542 in cooperation with the relative inter-plate spacings between slotted plates 516 and 518 and between slotted plates 518 and 520. The elimination of line-of-sight paths prevents light, typically in the visible region of the electromagnetic spectrum, generated by the direct plasma in plasma cavity 542, from entering the processing space 102, other than light redirected by reflection.

Figure 16:
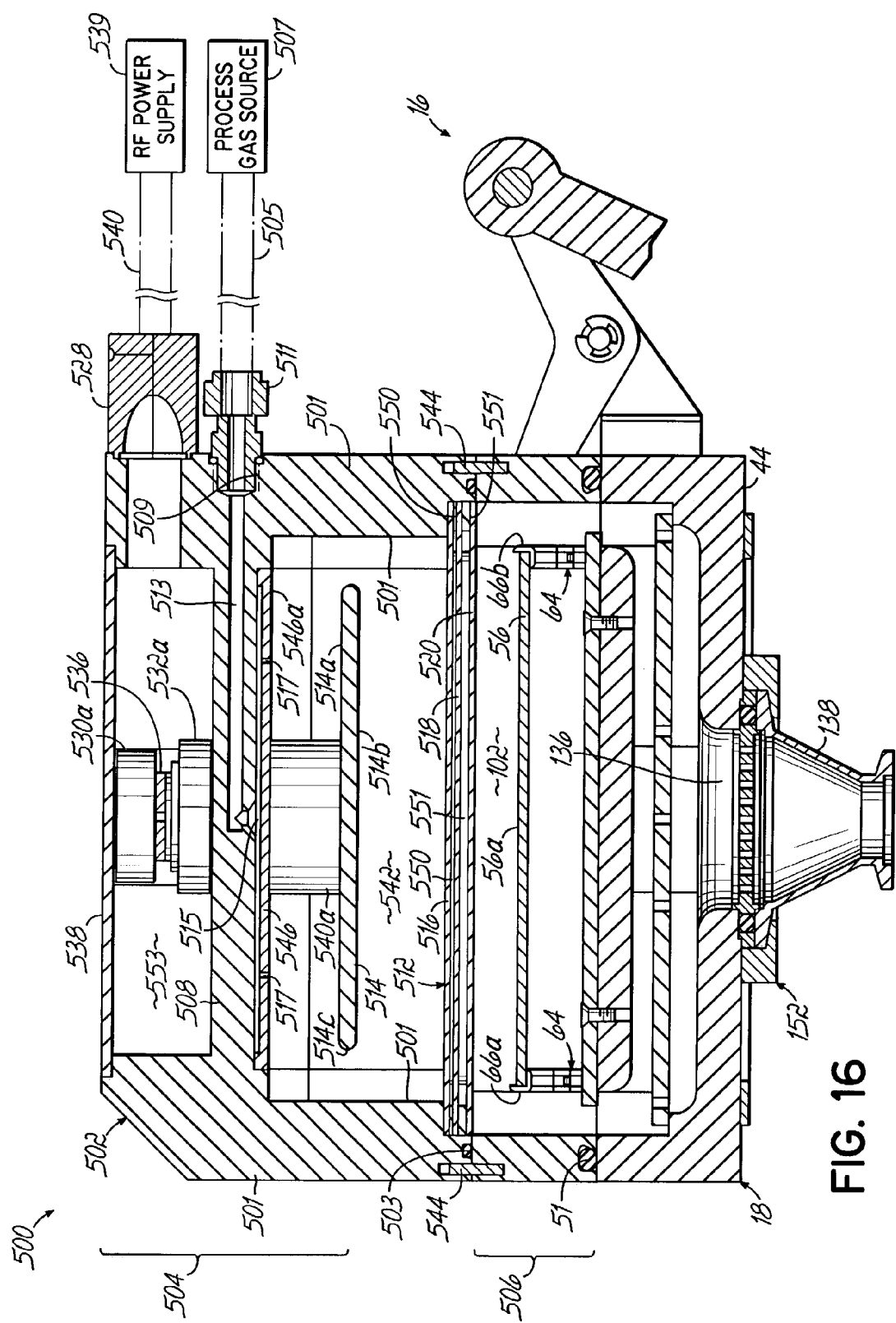
FIG. 16 is a sectional view similar to FIG. 10 of the, plasma chamber of FIG. 15.
Figure 17:
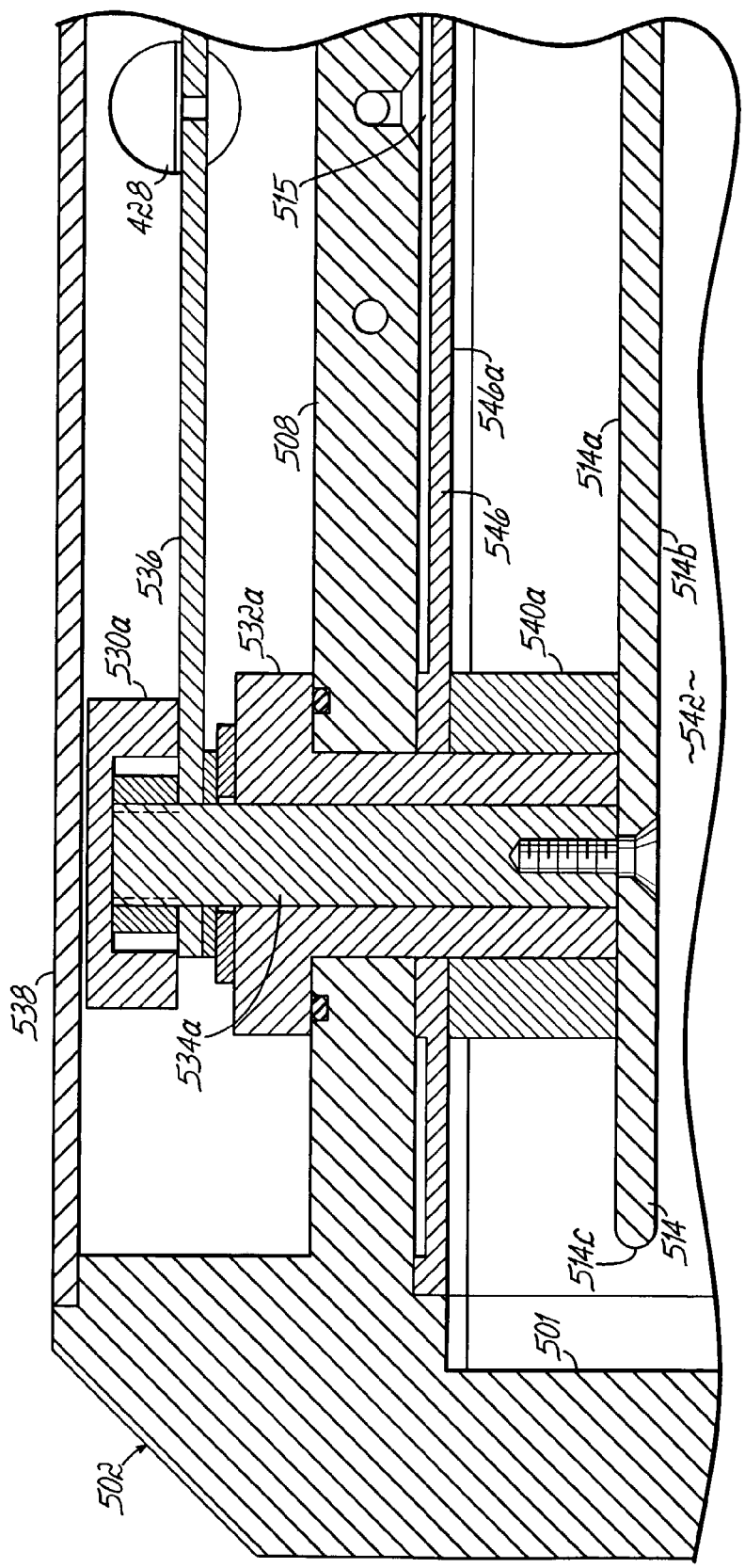
FIG. 17 is a detailed view of a portion of FIG. 16.
Figure 18:
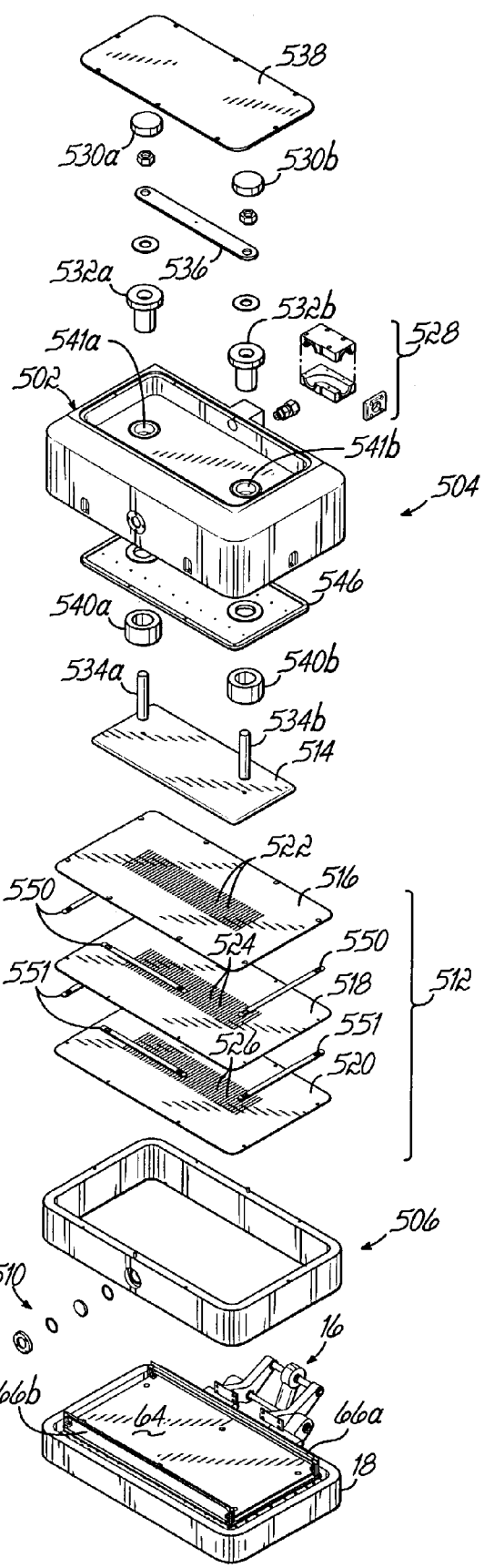
FIG. 18 is an exploded view of the plasma chamber of FIGS. 15–17.

With reference to FIGS. 15, 16 and 18, upper slotted plate 516 is spaced from the center slotted plate 518 by a plurality of, for example, four peripherally-arranged spacers 550 that supply a good electrical contact between plates 516 and 518. Similarly, lower slotted plate 520 is spaced from the center slotted plate 518 by a plurality of, for example, four peripherally-arranged spacers 551 that provide a good electrical contact between plates 518 and 520. Spacers 550 are dimensioned for separating plates 516 and 518 by a uniform gap and, similarly, spacers 551 are dimensioned for separating plates 518 and 520 by a uniform gap that may differ from the gap between plates 516 and 518.

It is contemplated by the invention that the slots 522, 524 and 526 may have any relative spatial arrangement that, in cooperation with the inter-plate spacings, eliminates, prohibits, or at least substantially reduces, line-of-sight paths between the plasma cavity 542 and the processing space 102. The invention also contemplates that the slots 522, 524, 526 may have a configuration, dimension, and/or arrangement compliant with the geometrical shape of the workpiece 56. In one embodiment, the slots 522, 524 and 526 are rectangular in cross-sectional profile viewed in a direction extending between processing space 102 and plasma cavity 542 and have a dimension along their major axis of approximately two (2) inches, a dimension along their minor axis of approximately 3/16 inches, a spacing between adjacent slots of about 3/32 inches, and the slots 524 are offset from slots 522 and slots 526 by 3/16 inches. The upper and center plates 516 and 518 are separated by a distance approximately equal to the plate thickness and the center and lower plates 518 and 520 are separated by a distance approximately equal to 1.5 times the plate thickness.

The grounded plate 512 prohibits the transfer of charged species, including ions and electrons, from the direct plasma in the plasma cavity 542 to the processing space 102 and allows the transfer of free radicals, and other process gas species lacking a net charge, from the plasma cavity 542 to the processing space 102. Specifically, the charged species are captured by the material of the slotted plates 516, 518, 520 surrounding the slots 522, 524, 526, respectively, which are grounded. The pumping action of vacuum pump 144 (FIG. 3) attracts the free radicals and neutral molecules through the slots 522, 524, 526 from plasma cavity 542 into the processing space 102 and toward the workpiece 56 to perform the downstream-type plasma treatment. The plasma in processing space 102 is a downstream-type plasma that is free, or substantially free, of charged particles and light for performing plasma treatments of the workpiece 56 by the chemical action of the radicals without the physical action otherwise provided by the charged particles. Typically, the grounded plate 512 is effective for removing substantially all of the charged species from the portion of the direct plasma transferred or admitted from plasma cavity 542 into the processing space 102. Typically, the grounded plate 512 is effective for removing at least about 90% of the charged particles and may be effective for removing 99% or more of the charged particles.

Figure 12:
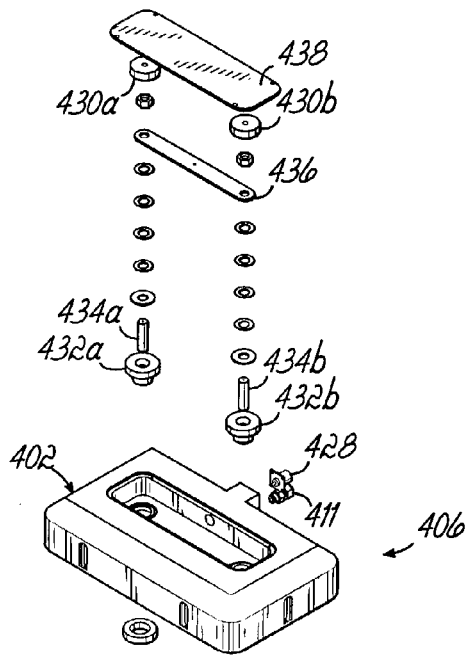
FIG. 12 is an exploded view of the plasma chamber of FIGS. 8–11.
Figure 12:
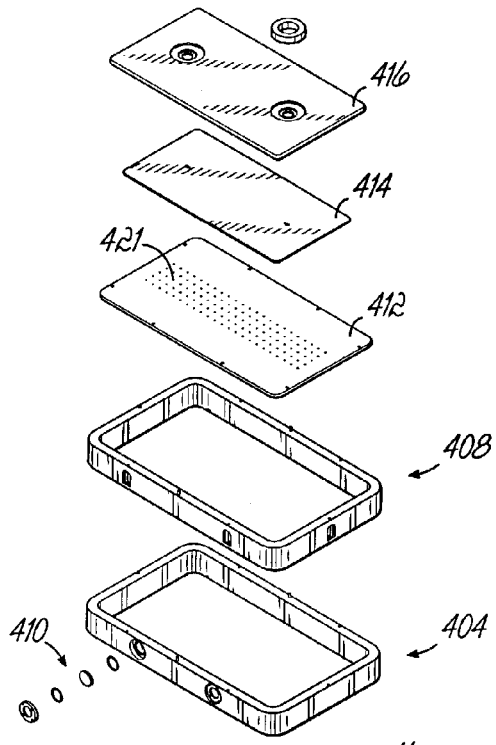
Figure 12:
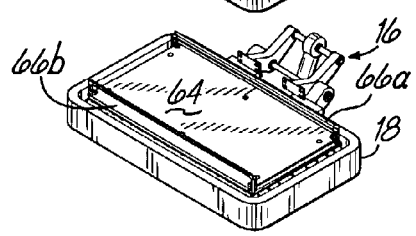

Grounded plate 512 is configured to be removable from the chamber lid 502 for changing the configuration, dimension, and/or arrangement of slots 522, 524, 526 to accommodate, for example, a change in the type of workpiece 56 being plasma treated, as described herein with regard to grounded plates 412, 418 and 420 (FIGS. 12–14). For example, the slots 522, 524, 526 may be dimensioned and arranged in a disk-shaped pattern for processing round workpieces, a square-shaped pattern for square workpieces, a rectangular pattern for rectangular workpieces, and other geometrical arrangements apparent to persons of ordinary skill in the art as necessary to correlate with the geometrical shape of the workpiece 56.

With reference to FIGS. 15–18, the chamber lid 502 further includes a radio-frequency (RF) bulkhead fitting 528, a pair of electrically-insulating caps 530a,b, a pair of dielectric spools 532a,b, a pair of power feedthroughs 534a,b, a power distribution bar 536, a removable radio-frequency (RF) lid closure element 538 that affords access to RF chamber 543, and a pair of annular ceramic spacers 540a,b. A radio-frequency (RF) power supply 539 is electrically coupled by a transmission line 540 with the RF bulkhead fitting 528. The RF power supply 539 and the components of the chamber lid 502 collectively provide a plasma excitation source capable of exciting process gas in the plasma cavity 542 to generate a plasma. Power feedthroughs 534a,b transfer RF power from the RF bulkhead fitting 528 and power distribution bar 536 to the powered electrode 514. The RF power supply 539 typically operates at a frequency between about 40 kHz and about 13.56 MHz, preferably about 13.56 MHz, and a power between about 0 watts and about 600 watts, typically about 50 watts to about 600 watts.

The power feedthroughs 534a,b and ceramic spools 532a,b are positioned in respective openings 541a,b extending through dividing wall 508. Cap 530a is fastened to the top of power feedthrough 534a and is positioned between power distribution bar 536 and closure element 538. Ceramic spool 532a has a flange that is captured between the dividing wall 508 and the power distribution bar 536, and power feedthrough 534a extends through the bore of ceramic spool 532a to establish electrical contact between the power distribution bar 536 and the powered electrode 514. Cap 530b is fastened to the top of power feedthrough 534b and is positioned between power distribution bar 536 and closure element 538. Ceramic spool 532b has a flange captured between the dividing wall 508 and the power distribution bar 536, and power feedthrough 534b extends through the bore of ceramic spool 532b to establish electrical contact between the power distribution bar 536 and the powered electrode 514. The ceramic spacer 540a is captured between the dividing wall 508 and the powered electrode 514 and is concentric with ceramic spool 532a. Similarly, the ceramic spacer 540b is captured between the dividing wall 508 and the powered electrode 514 and is concentric with ceramic spool 532b. The caps 530a,b cooperate to electrically isolate the power bar 536 and upper ends of the power feedthroughs 534a,b from the closure element 538. The ceramic spools 532a,b and the ceramic spacers 540a,b cooperate to electrically isolate the power feedthroughs 534a,b from the dividing wall 508 of domed ceiling section 504.

With continued reference to FIGS. 15–18, the powered electrode 514 is positioned within the plasma cavity 542 such that its planar upper surface 514a, planar lower surface 514b and side edge 514c are positioned substantially equidistantly from adjacent surrounding surfaces of the domed ceiling section 504 and the grounded plate 512 that are electrically grounded. Specifically, upper surface 514a is separated vertically from, and in a generally parallel relationship with, a downwardly-facing planar surface 546a of gas distribution baffle 546 by approximately the same distance that lower surface 514b is separated from an upwardly-facing planar surface 516a of the upper slotted plate 516. The surfaces 514b and 516a have a generally parallel relationship. In addition, the transverse distance between the side surface 514c and adjacent portions of an inwardly-facing surface 501a of side wall 501 is approximately equal to the separations between surfaces 514a and 546a and surfaces 514b and 516a. It follows that the powered electrode 514 is symmetrically positioned relative to and equidistant from surfaces 501a, 546a and 516a. In one specific embodiment that provides a particularly uniform plasma in plasma cavity 542 and, consequently, a particularly uniform downstream-type plasma in processing space 102, the separations between the powered electrode 514 and surfaces 501a, 546a and 516a are each approximately one (1) inch. The equidistant spacing and the magnitude of the spacing cooperate to permit application of full power, without ramping, from RF power supply 539 to the powered electrode 514 without inducing plasma spikes, arcing, energy hot spots, or plasma instability.

In use and with continued reference to FIGS. 15–18, process gas enters the chamber lid 502 through the gas port 509 and is directed through gas passageways 513 to the upper side of gas distribution baffle 546. Gas flows from the upper side of gas distribution baffle 546 through gas outlets 517 into the plasma cavity 542, which promotes uniform process gas distribution in the plasma cavity 542. The RF energy applied between the grounded plate 512 and the powered electrode 514 ignites and sustains a plasma from the process gas residing in plasma cavity 542. The plasma in plasma cavity 542 is a full direct plasma containing ions, electrons, free radicals and molecular species. Because the flow of process gas in the plasma treatment system 10 is generally conducted toward exhaust port 136 in bottom wall 44, the various components of the direct plasma in plasma cavity 542 will be attracted by a suction or vacuum force toward the slotted plates 516, 518, and 520 that collectively constitute the grounded plate 512. Charged species, such as electrons and ions, recombine inside slots 522, 524, and 526 because grounded plate 512 is grounded relative to earth ground. As a result, ions and electrons are significantly less likely to enter processing space 102. The grounded plate 512 permits plasma species lacking a net charge, such as free radicals and neutral molecules of process gas, to be transported through slots 522, 524, and 526 into the processing space 102. The relative arrangement of slots 522, 524, and 526 and the spatial relationship between the upper and center slotted plates 516, 518 and the center and lower slotted plates 518, 520 eliminates, or substantially eliminates, line-of-sight paths from the plasma cavity 542 to the processing space 102 so that light generated by the direct plasma in the plasma cavity 542 is not visible in processing space 102.

The vacuum or the pumping action of vacuum pump 144 (FIG. 3) urges the free radicals and neutral molecules toward the workpiece 56 to perform the downstream-type plasma treatment. The workpiece 56 to be treated with the downstream-type plasma is supported by the side rails 66a, 66b of substrate support 64. Free radicals admitted into processing space 102 contact with the exposed surface 56a of workpiece 56 and react chemically with the material forming the workpiece 56 or contamination covering the exposed surface 56a to perform the surface treatment. Excess free radicals, unreactive process gas molecules, and contaminants removed from the workpiece 56 are exhausted from the processing space 102 by the pumping action of vacuum pump 144.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicants' general inventive concept. The scope of the invention itself should only be defined by the appended claims.

We claim:

1. An apparatus for treating a workpiece with plasma, comprising:
   a vacuum chamber having a chamber base and a chamber lid movable relative to said chamber base between a closed position that defines a processing space and an open position for transferring a workpiece into and out of said processing space, said chamber lid including a first sidewall section capable of being removed from said chamber lid for changing a vertical dimension of said vacuum chamber;
   a vacuum port in said vacuum chamber for evacuating said processing space;
   a workpiece holder located in said processing space;
   a process gas supply port in said vacuum chamber for introducing a process gas to said processing space; and
   a plasma excitation source operable to provide a plasma in said processing space from the process gas.

2. The apparatus of claim 1 wherein said chamber lid further comprises a plasma cavity, and said plasma excitation source includes a powered electrode and a grounded plate with a plurality of openings positioned between said plasma cavity and said processing space prohibiting the transfer of at least a portion of ions in the plasma from said plasma cavity to said processing space and allowing the transfer of at least a portion of free radicals in the plasma from said plasma cavity to said processing space.

3. The apparatus of claim 2 wherein said chamber lid further includes a ceiling section, and further comprising a second sidewall in sealing engagement with said chamber base, said first sidewall section being positioned between said ceiling section and said second sidewall section.

4. The apparatus of claim 3 further comprising a guide for aligning said first sidewall section with said second sidewall section.

5. The apparatus of claim 4 wherein said guide further aligns said second sidewall section with said ceiling section.

6. The apparatus of claim 3 further comprising a guide for aligning said first sidewall section with said ceiling section.

7. The apparatus of claim 1 wherein said plasma excitation source comprises a first powered electrode that is part of an assembly including said workpiece holder.

8. The apparatus of claim 1 further comprising:
a loading station configured for introducing the workpiece to said workpiece holder when said chamber lid is in the open position; and
an exit station configured for removing the workpiece from said workpiece holder when said chamber lid is in the open position.

9. The apparatus of claim 1 wherein said chamber lid further includes said process gas supply port and a plurality of passageways for distributing the process gas received from said process gas supply port to said plasma cavity.

10. The apparatus of claim 9 wherein said plasma excitation source includes a powered electrode located in said plasma cavity and an electrode insulator positioned between said powered electrode and said chamber lid, and said plurality of passageways includes a plurality of outlets proximate to said electrode insulator emitting the process gas that seeps around an outer periphery of said electrode insulator and an outer periphery of said powered electrode for substantially uniform distribution into said plasma cavity.

* * * * *

UNITED STATES PATENT AND TRADEMARK OFFICE
CERTIFICATE OF CORRECTION

PATENT NO. : 7,013,834 B2  Page 1 of 1
APPLICATION NO. : 10/324436
DATED : March 21, 2006
INVENTOR(S) : James Scott Tyler et al.

It is certified that error appears in the above-identified patent and that said Letters Patent is hereby corrected as shown below:

Column 4

Line 34, delete "," after the.

Column 19

Line 20, delete "-" after and .

Column 23

Line 17, change "sideWall" to --sidewall--.

Column 29

Line 3, add --section-- after sidewall.

Signed and Sealed this

Eighth Day of August, 2006

JON W. DUDAS
*Director of the United States Patent and Trademark Office*